(12) United States Patent
Lai et al.

(10) Patent No.: US 12,218,058 B2
(45) Date of Patent: Feb. 4, 2025

(54) INTEGRATED CIRCUITS HAVING STACKED TRANSISTORS AND BACKSIDE POWER NODES

(71) Applicant: TAIWAN SEMICONDUCTOR MANUFACTURING COMPANY, LTD., Hsinchu (TW)

(72) Inventors: Chih-Yu Lai, Hsinchu (TW); Chih-Liang Chen, Hsinchu (TW); Li-Chun Tien, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 705 days.

(21) Appl. No.: 17/459,818

(22) Filed: Aug. 27, 2021

(65) Prior Publication Data

US 2023/0067311 A1 Mar. 2, 2023

(51) Int. Cl.
*H01L 23/528* (2006.01)
*H01L 21/02* (2006.01)
*H01L 21/8238* (2006.01)
*H01L 27/092* (2006.01)
*H01L 29/06* (2006.01)
(Continued)

(52) U.S. Cl.
CPC .... *H01L 23/5286* (2013.01); *H01L 21/02603* (2013.01); *H01L 21/823807* (2013.01); *H01L 21/823871* (2013.01); *H01L 27/0922* (2013.01); *H01L 29/0665* (2013.01); *H01L 29/42392* (2013.01); *H01L 29/66439* (2013.01); *H01L 29/66742* (2013.01); *H01L 29/775* (2013.01); *H01L 29/78696* (2013.01)

(58) Field of Classification Search
CPC ............... H01L 23/5286; H01L 23/535; H01L 23/0673; H01L 21/02603; H01L 21/823807; H01L 21/823871; H01L 21/76895; H01L 21/8221; H01L 27/0922; H01L 27/0688; H01L 27/092; H01L 29/0665; H01L 29/42392; H01L 29/66439; H01L 29/66742; H01L 29/775; H01L 29/78696; B82Y 10/00
See application file for complete search history.

(56) References Cited

U.S. PATENT DOCUMENTS 7,260,442 B2 8/2007 Hwang et al.
9,256,709 B2 2/2016 Yu et al.
(Continued)

*Primary Examiner* — Herve-Louis Y Assouman
*Assistant Examiner* — Linda J. Fleck
(74) *Attorney, Agent, or Firm* — Hauptman Ham LLP

(57) ABSTRACT

An integrated circuit device includes a first-type active-region semiconductor structure, a second-type active-region semiconductor structure stacked with the first-type active-region semiconductor structure, a front-side power rail in a front-side conductive layer, and a back-side power rail in a back-side conductive layer. The integrated circuit device also includes a source conductive segment intersecting the first-type active-region semiconductor structure at a source region of a transistor, a back-side power node in the back-side conductive layer, and a top-to-bottom via-connector. The source conductive segment is conductively connected to the front-side power rail through a front-side terminal via-connector. The top-to-bottom via-connector is connected between the source conductive segment and the back-side power node.

20 Claims, 30 Drawing Sheets

(51) Int. Cl.
    *H01L 29/423*     (2006.01)
    *H01L 29/66*     (2006.01)
    *H01L 29/775*     (2006.01)
    *H01L 29/786*     (2006.01)

(56) References Cited

U.S. PATENT DOCUMENTS

| | | |
|---|---|---|
| 2014/0040838 A1 | 2/2014 | Liu et al. |
| 2015/0278429 A1 | 10/2015 | Chang |
| 2019/0288004 A1* | 9/2019 | Smith ............... H01L 21/76895 |
| 2021/0118799 A1* | 4/2021 | Liebmann ........... H01L 23/5286 |
| 2022/0223514 A1* | 7/2022 | Sisodia .................. H10B 10/00 |
| 2022/0271033 A1* | 8/2022 | Chanemougame ......................... H01L 21/0259 |
| 2023/0062140 A1* | 3/2023 | Lai ...................... H01L 27/0688 |

\* cited by examiner

FIG. 11A

INTEGRATED CIRCUITS HAVING STACKED TRANSISTORS AND BACKSIDE POWER NODES

BACKGROUND

An integrated circuit (IC) typically includes a number of IC devices that are manufactured in accordance with one or more IC layout diagrams. IC devices sometimes include complementary field effect transistor (CFET) devices. A CFET device generally has an upper FET overlying a lower FET in a stacked configuration. Both the upper FET and the lower FET in a CFET device are positioned above the conductive lines in a back-side conductive layer but below the conductive lines in a front-side conductive layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 11A-11B are layout diagrams of integrated circuits having the circuit cells implemented with back-side power nodes, in accordance with some embodiments.

DETAILED DESCRIPTION

Figure 1A:
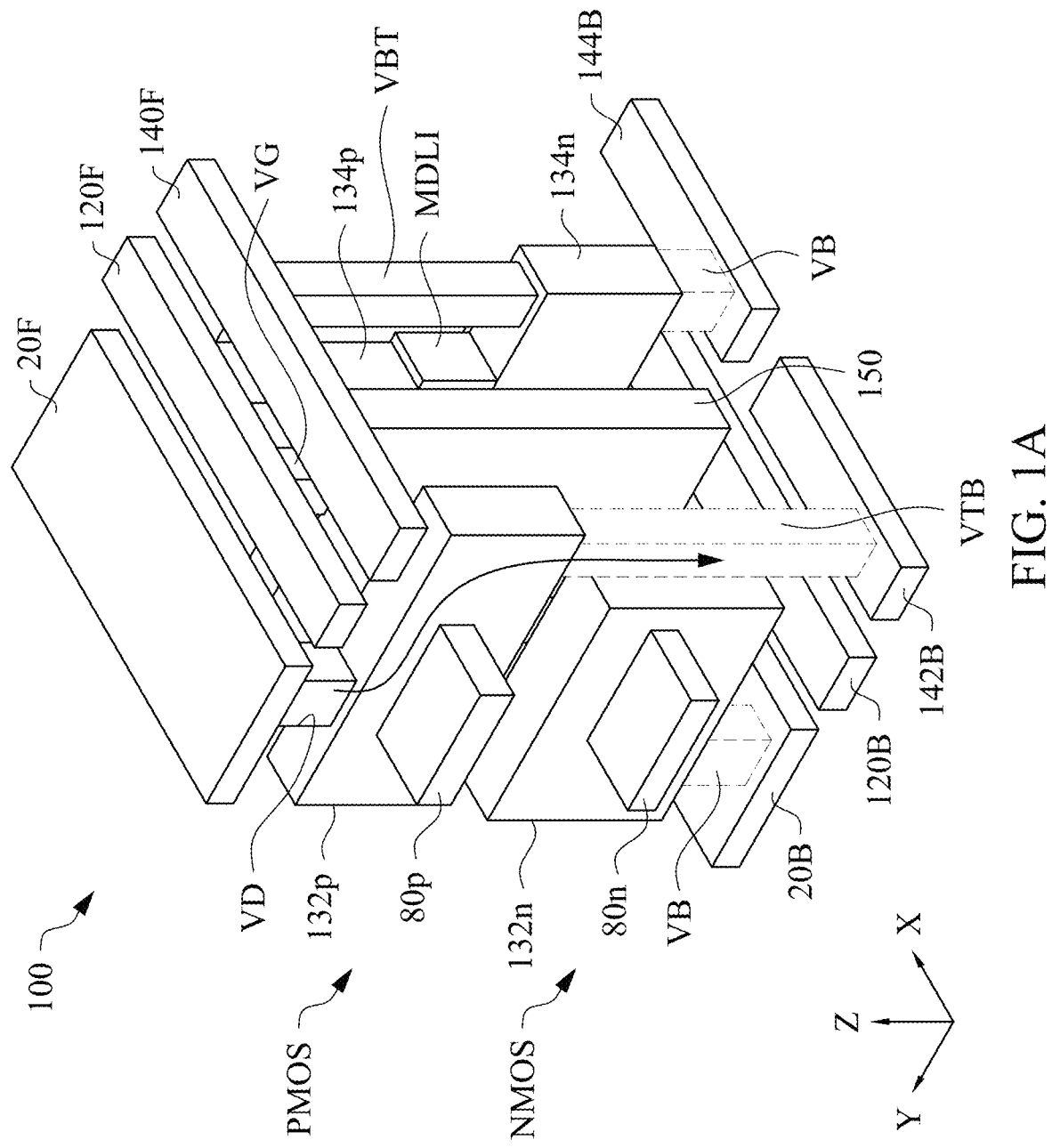
FIG. 1A is a perspective view of an inverter circuit IC structure, implemented with a CFET, having power rails and signal lines in both a front-side conductive layer and a back-side conductive layer, in accordance with some embodiments.

The following disclosure provides many different embodiments, or examples, for implementing different features of the provided subject matter. Specific examples of components, materials, values, steps, operations, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A complementary field effect transistor (CFET) generally has a first-type transistor stacked with a second-type transistor. The first-type transistor has a channel region in a first-type active-region semiconductor structure, and the second-type transistor has a channel region in a second-type active-region semiconductor structure. An IC device having CFET transistors often includes a front-side power rail in a front-side conductive layer above the CFET transistors and a back-side power rail in a back-side conductive layer below the CFET transistors. In some embodiments, the front-side power rail is in a metal layer MO on the front side of a substrate, while a back-side power rail in a metal layer BMO on the back side of the substrate. The IC device also includes upper conductive segments intersecting the first-type active-region semiconductor structure and conductively connected to the front-side power rail through one or more front-side terminal via-connectors. In some embodiments, the IC device includes a back-side power node in the back-side conductive layer and a top-to-bottom via-connector for connecting the back-side power node to an upper conductive segment. In some embodiments, because one or more back-side power nodes are implemented in an IC device, the number of power pickup cells in the IC device is reduced. In some embodiments, due to the decreased number of power pickup cells, the total area occupied by circuit cells in the IC device is reduced. In some embodiments, the back-side power nodes enable the reduction of the IR drops between some front-side power rails and some back-side conducting lines. In some embodiments, a back-side power node can function as a signal shield for reducing the capacitive couplings between two back-side signal lines.

FIG. 1A is a perspective view of an inverter circuit IC structure 100, implemented with a CFET, having power rails and signal lines in both a front-side conductive layer and a back-side conductive layer, in accordance with some embodiments. In FIG. 1A, the inverter circuit IC structure 100 incudes a p-type active-region semiconductor structure 80p extending in the X-direction and an n-type active-region semiconductor structure 80n extending in the X-direction. The X-direction, the Y-direction, and the Z-direction in FIG. 1A are mutually orthogonal to each other and form an orthogonal coordinate frame. The p-type active-region semiconductor structure 80p is stacked with the n-type active-region semiconductor structure 80n and shifted from the n-type active-region semiconductor structure along the Z-direction. A gate-conductor 150 extending in the Y-direction intersects both the p-type active-region semiconductor structure 80p and the n-type active-region semiconductor structure 80n. The gate-conductor 150 functions as two stacked gate-conductors conductively joined together: one of the two gate-conductors intersects the p-type active-region semiconductor structure 80p at a channel region of a PMOS transistor, and another one of the two gate-conductors intersects the n-type active-region semiconductor structure 80n at a channel region of an NMOS transistor. The gate-conductor 150 is conductively connected to the gate terminals of the PMOS transistor and the NMOS transistor. In some embodiments, each of the p-type active-region semiconductor structure 80p and the n-type active-region semiconductor structure 80n includes one or more nano-sheets, and consequently, each of the PMOS transistor and the NMOS transistor is a nano-sheet transistor. In some embodiments, each of the p-type active-region semiconductor structure 80p and the n-type active-region semiconductor structure 80n includes one or more nano-wires, and consequently, each of the PMOS transistor and the NMOS transistor is a nano-wire transistor.

The inverter circuit IC structure 100 also includes conductive segments 132p, 134p, 132n, and 134n. Each of the conductive segments 132p and 134p, extending in the Y-direction, intersects the p-type active-region semiconductor structure 80p at one of the terminal regions of the PMOS transistor. Each of conductive segments 132n and 134n, extending in the Y-direction, intersects the n-type active-region semiconductor structure 80n at one of the terminal regions of the NMOS transistor. A terminal region of a transistor is either a source region or a drain region of the transistor. The conductive segment 132p, as a source conductive segment, forms a source terminal of the PMOS transistor. The conductive segment 132n, as a source conductive segment, forms a source terminal of the NMOS transistor. The conductive segment 134p, as a drain conductive segment, forms a drain terminal of the PMOS transistor. The conductive segment 134n, as a drain conductive segment, forms a drain terminal of the NMOS transistor. The conductive segment 134p and the conductive segment 134n are conductively connected through a conductive-segment inter-connector MDLI. While the drain terminals of the PMOS transistor and the NMOS transistor are conductively connected together by the conductive-segment inter-connector MDLI, the source terminal of the PMOS transistor is conductively connected to a front-side power rail 20F through a front-side terminal via-connector VD, and the source terminal of the NMOS transistor is conductively connected to a back-side power rail 20B through a back-side terminal via-connector VB. The front-side power rail 20F is configured to maintain a first supply voltage VDD, and the back-side power rail 20B is configured to maintain a second supply voltage VSS.

The front-side power rail 20F extending in the X-direction is in a front-side conductive layer. The back-side power rail 20B extending in the X-direction is in a back-side conductive layer. Each of the front-side conductive layer and the back-side conductive layer is in a plane having the normal vector orientated towards the Z-direction. The front-side conductive layer is above both the p-type active-region semiconductor structure 80p and the n-type active-region semiconductor structure 80n. The back-side conductive layer is below both the p-type active-region semiconductor structure 80p and the n-type active-region semiconductor structure 80n.

In FIG. 1A, the inverter circuit IC structure 100 includes front-side signal lines 120F and 140F in the front-side conductive layer and also back-side signal lines 120B and 144B in the back-side conductive layer. The front-side signal line 120F is conductively connected to the gate-conductor 150 through a front-side gate via-connector VG and configured as an input signal line of the inverter circuit. The front-side signal line 140F is conductively connected to the conductive segment 134n through a bottom-to-top via-connector VBT and configured as an output signal line of the inverter circuit. In some embodiments, the conductive segment 134n is also conductively connected to the back-side signal line 144B through a back-side terminal via-connector VB, and the back-side signal line 144B is also figured as an output signal line of the inverter circuit IC structure. In some embodiments, the back-side signal line 120B in FIG. 1A is not directly connected to any circuit nodes in the inverter circuit IC structure 100, the back-side signal line 120B is configured to route signals between neighboring cells at opposite sides of the inverter circuit IC structure. For example, in some embodiments, through one of the back-side signal lines 120B, a signal from a neighboring cell adjacent to the conductive segments 132p and 132n is coupled to another neighboring cell adjacent to the conductive segments 134p and 134n.

In FIG. 1A, the inverter circuit IC structure 100 includes a back-side power node 142B configured to have a supply voltage equal to the supply voltage on the front-side power rail 20F. For example, in FIG. 1A, the back-side power node 142B is conductively connected to the conductive segment 132p through a top-to-bottom via-connector VTB, and the conductive segment 132p is conductively connected to the front-side power rail 20F through a front-side terminal via-connector VD.

Figure 1B:
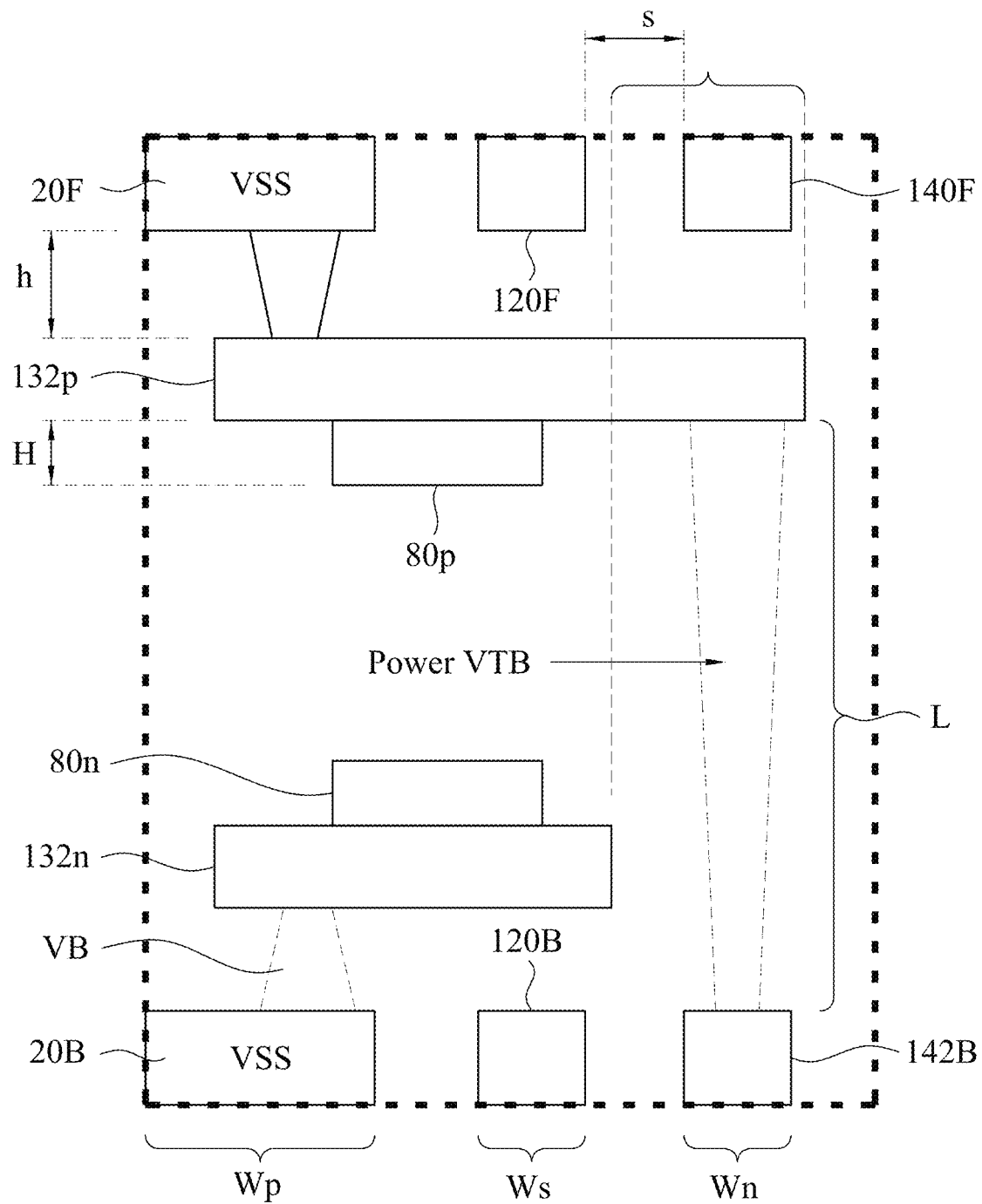
FIG. 1B is a schematic diagram of some elements and some connections in the inverter circuit IC structure of FIG. 1A, in accordance with some embodiments.

FIG. 1B is a schematic diagram of some elements and some connections in the inverter circuit IC structure of FIG. 1A, in accordance with some embodiments. In FIG. 1B, each of the front-side power rail 20F and the front-side signal lines (120F and 140F) is in the front-side conductive layer above the p-type active-region semiconductor structure 80p and the n-type active-region semiconductor structure 80n. The front-side power rail 20F is conductively connected to a front-side power rail 20F through the front-side terminal via-connector VD. Each of the back-side power rail 20B and the back-side signal line 144B is in the back-side conductive layer below the p-type active-region semiconductor structure 80p and the n-type active-region semiconductor structure 80n. The back-side power rail 20B is conductively connected to the back-side power rail 20B through the back-side terminal via-connector VB. The back-side power node 142B is also in the back-side conductive layer below the p-type active-region semiconductor structure 80p and the n-type active-region semiconductor structure 80n. The back-side power node 142B is conductively connected to the conductive segment 132p through a top-to-bottom via-connector VTB. In some embodiments, the thickness of the p-type active-region semiconductor structure 80p is H (as shown in FIG. 1B), the length L of the top-to-bottom via-connector VTB is in a range from 6H to 40H. In some embodiments, the lateral distance D between an edge of the conductive segment 132p and an edge of the n-type active-region semiconductor structure 80n, for accommodating the top-to-bottom via-connector VTB, is in a range from 2H to 5H. In some embodiments, the width Wn of the back-side power node 142B is in a range from 0.5H to 3H. In some embodiments, the width Wp of the power rails (e.g., 20F or 20B) is in a range from H to 5H, the width Ws of each signal line (e.g., 120F, 140F, or 120B) is in a range from 0.5H to 3H, and the spacing S between two signal lines (e.g., 120F and 140F) is in a range from 0.5H to 3H. In some embodiments, the length h of each terminal via-connector (e.g., VD or VB) is in a range from 2H to 6H.

Figure 2A:
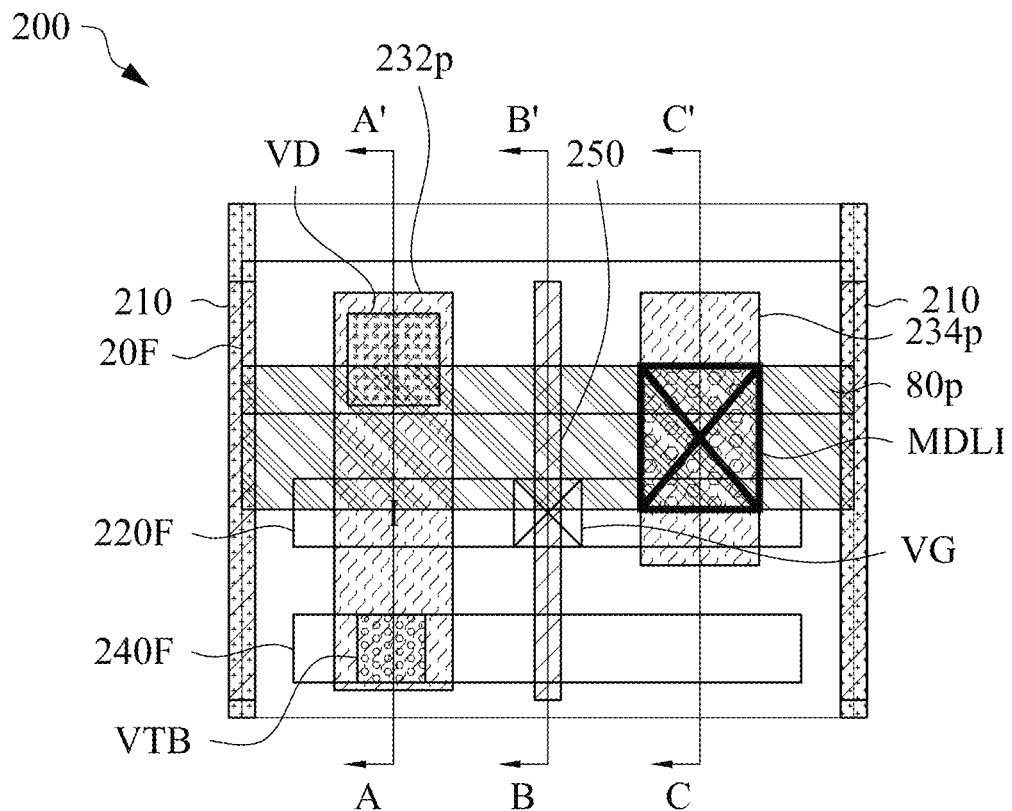
FIG. 2A are layout diagrams of an inverter circuit, in accordance with some embodiments.
Figure 2A:
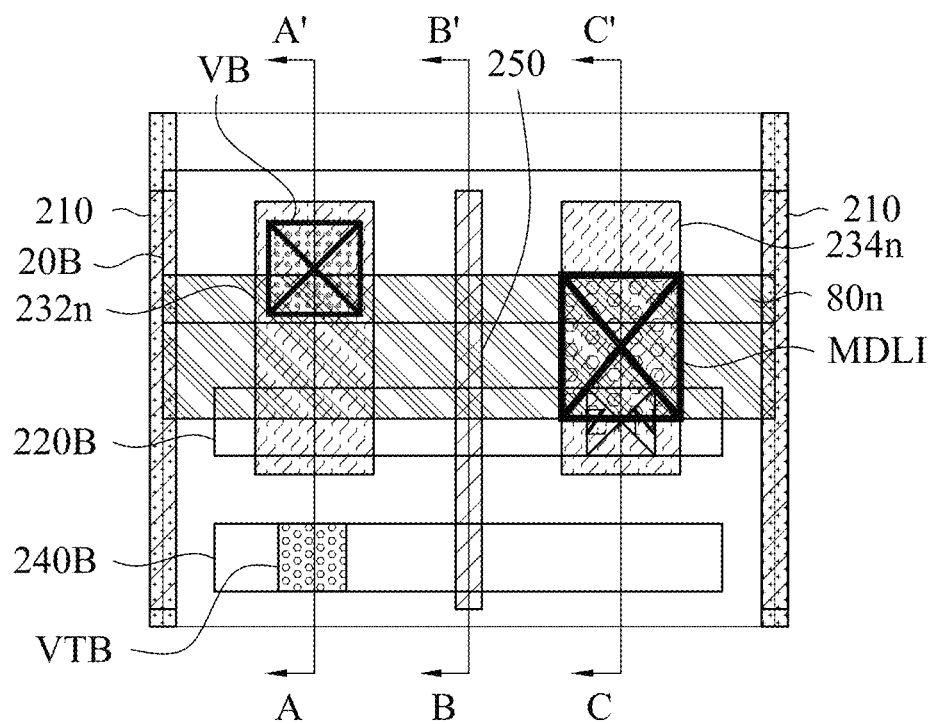
Figure 2B:
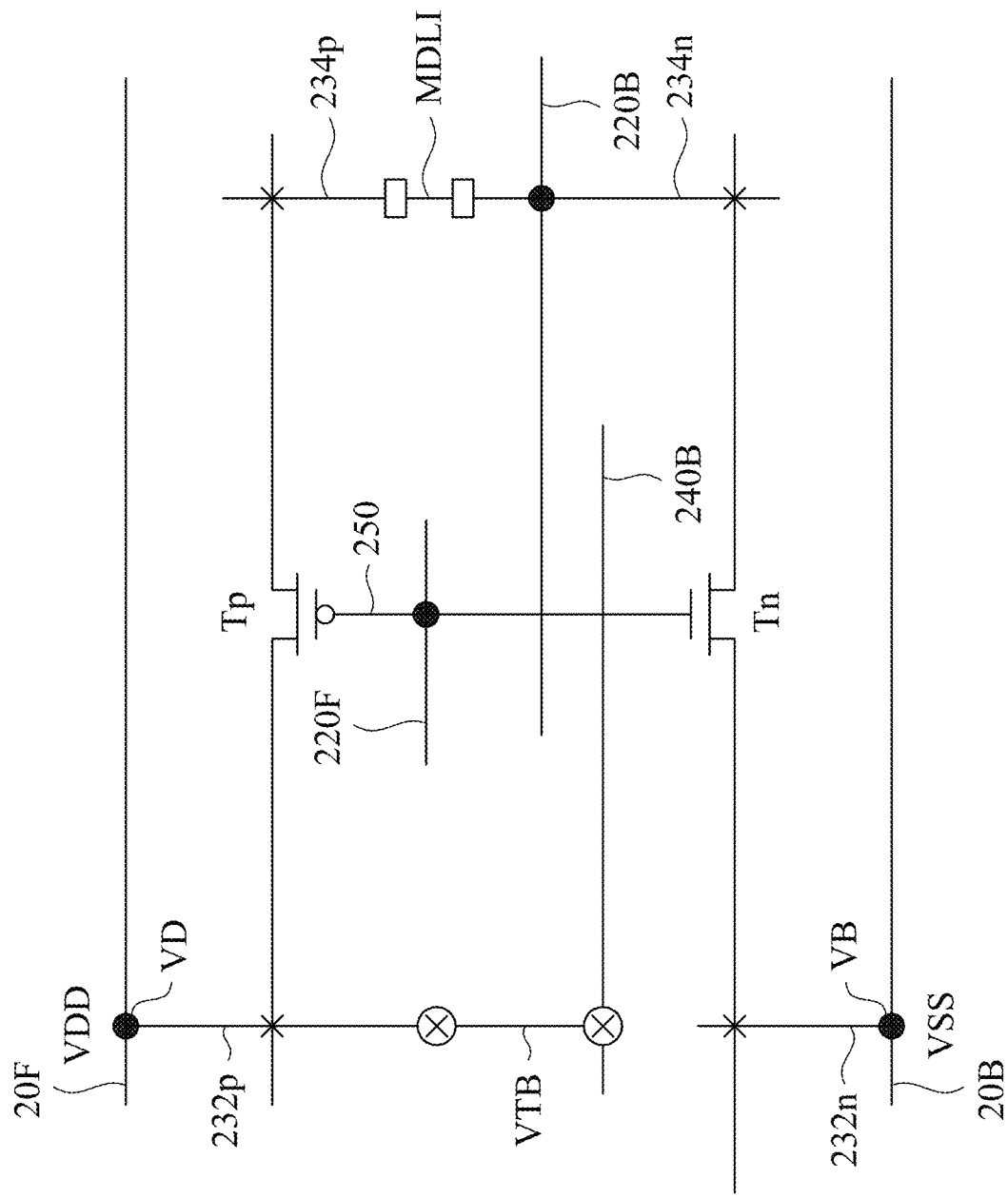
FIG. 2B is an equivalent circuit of the inverter circuit as specified by the layout diagrams in FIG. 2A, in accordance with some embodiments.

FIG. 2A are layout diagrams of an inverter circuit 200, in accordance with some embodiments. FIG. 2B is an equivalent circuit of the inverter circuit 200 as specified by the layout diagram in FIG. 2A, in accordance with some embodiments. The layout diagrams in FIG. 2A include an upper layout diagram and a lower layout diagram. The upper layout diagram includes the layout patterns for specifying the p-type active-region semiconductor structure 80p, the gate-conductor 250, the conductive segments 232p and 234p, the front-side signal lines 220F and 240F, the front-side power rail 20F, the conductive-segment inter-connector MDLI, the dummy gate-conductors 210, and various via-connectors. The lower layout diagram includes the layout patterns for specifying the n-type active-region semiconductor structure 80n, the gate-conductor 250, the conductive segments 232n and 234n, the back-side signal line 220B, the back-side power node 240B, the back-side power rail 20B, the conductive-segment inter-connector MDLI, the dummy gate-conductors 210, and various via-connectors.

As specified by the upper layout diagram in FIG. 2A, each of the p-type active-region semiconductor structure 80p, the front-side signal lines 220F and 240F, and the front-side power rail 20F extends in the X-direction. The gate-conductor 250 extending in the Y-direction intersects the p-type active-region semiconductor structure 80p at the channel region of a PMOS transistor. The conductive segment 232p extending in the Y-direction intersects the p-type active-region semiconductor structure 80p at the source region of the PMOS transistor. The conductive segment 234p extending in the Y-direction intersects the p-type active-region semiconductor structure 80p at the drain region of the PMOS transistor. The conductive segment 232p and the front-side power rail 20F are conductively connected through a front-side terminal via-connector VD. The gate-conductor 250 and the front-side signal lines 220F are conductively connected through a front-side gate via-connector VG.

As specified by the lower layout diagram in FIG. 2A, each of the n-type active-region semiconductor structure 80n, the back-side signal line 220B, the back-side power node 240B, and the back-side power rail 20B extends in the X-direction. The gate-conductor 250 extending in the Y-direction intersects the n-type active-region semiconductor structure 80n at the channel region of a NMOS transistor. The conductive segment 232n extending in the Y-direction intersects the n-type active-region semiconductor structure 80n at the source region of the NMOS transistor. The conductive segment 234n extending in the Y-direction intersects the n-type active-region semiconductor structure 80n at the drain region of the NMOS transistor. The conductive segment 232n and the back-side power rail 20B are conductively connected through a back-side terminal via-connector VB.

In FIG. 2A, the layout pattern for the top-to-bottom via-connector pattern VTB in the upper layout diagram and the layout pattern for the top-to-bottom via-connector pattern VTB in the lower layout diagram are matched with each other in identical shapes and at identical positions in the X-Y coordinate. The matched pair of layout patterns for the top-to-bottom via-connector pattern VTB specifies that the conductive segment 232p and the back-side power node 240B are conductively connected together along the Z-direction through a top-to-bottom via-connector VTB. In FIG. 2A, the inter-connector pattern MDLI overlying the conductive segment 234p in the upper layout diagram and the inter-connector pattern MDLI overlying the conductive segment 234n in the lower layout diagram are matched with each other in identical shapes and at identical positions in the X-Y coordinate. The matched pair of inter-connector patterns MDLI in the layout diagrams specifies that the conductive segment 234p and the conductive segment 234n in the inverter circuit 200 are conductively connected together through a conductive-segment inter-connector MDLI.

In FIG. 2A, the upper layout diagram and the lower layout diagram also includes dummy gate-conductors patterns 210 for specifying the dummy gate-conductors at the edges of the inverter circuit cell. In some embodiments, the intersections between dummy gate-conductor patterns 210 and the layout pattern of the p-type active-region semiconductor structure 80p specify the isolation regions in the p-type active-region semiconductor structure 80p for isolating the p-type active-region in the inverter circuit cell from the active-regions in the neighboring cells. In some embodiments, the intersections between dummy gate-conductor patterns 210 and the layout pattern of the n-type active-region semiconductor structure 80n specify the isolation regions in the n-type active-region semiconductor structure 80n for isolating the n-type active-region in the inverter circuit cell from the active-regions in the neighboring cells. In some embodiments, the isolation regions in the active-region semiconductor structures (80p or 80n) are created based on the poly on oxide definition edge (PODE) technology or based on the continuous poly on oxide definition (CPODE) technology. Other suitable technologies for generating the isolation regions in the active-region semiconductor structures (80p or 80n) are also within the contemplated scope of the present disclosure.

Figure 3A:
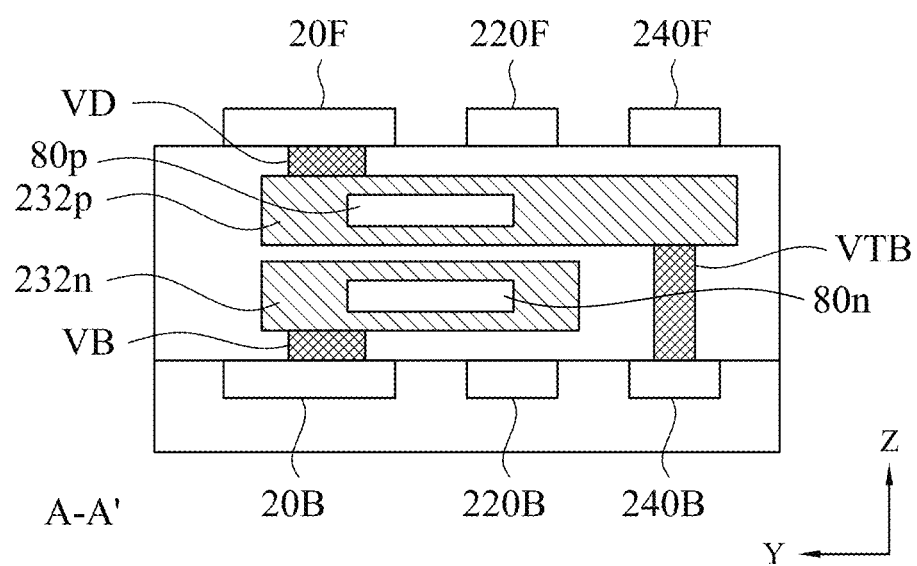
FIGS. 3A-3C are cross-sectional views of the inverter circuit as specified by the layout diagrams in FIG. 2A, in accordance with some embodiments.
Figure 3B:
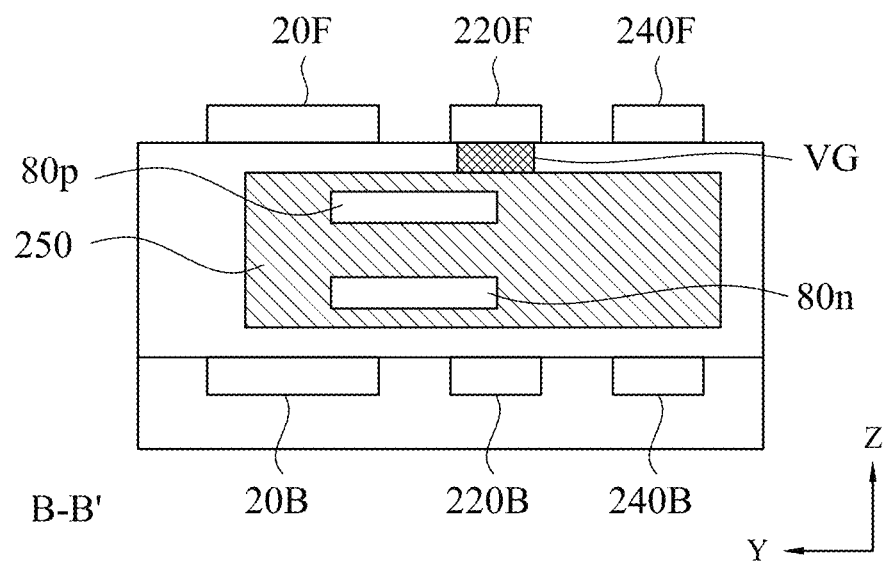
Figure 3C:
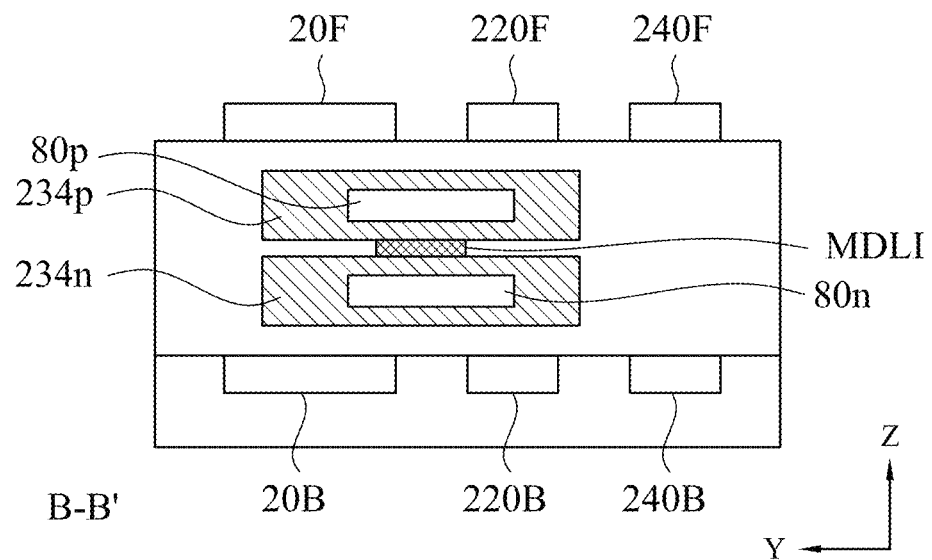

FIGS. 3A-3C are cross-sectional views of the inverter circuit 200 as specified by the layout diagram in FIG. 2A, in accordance with some embodiments. The cross-sectional views of the inverter circuit 200 in cutting planes as specified by the lines A-A', B-B', and C-C' are correspondingly depicted in FIG. 3A, FIG. 3B, and FIG. 3C. In FIGS. 3A-3C, the p-type active-region semiconductor structure 80p is stacked with n-type active-region semiconductor structure 80n. The front-side power rail 20F is in the front-side conductive layer which is above the p-type active-region semiconductor structure 80p and the n-type active-region semiconductor structure 80n. The front-side signal lines 220F and 240F are also in the front-side conductive layer. The back-side power rail 20B is in the back-side conductive layer which is below the p-type active-region semiconductor structure 80p and the n-type active-region semiconductor structure 80n. The back-side signal lines 220B and the back-side power node 240B are also in the back-side conductive layer.

In FIG. 3A, the front-side power rail 20F is conductively connected to the conductive segment 232p through the front-side terminal via-connector VD. The back-side power rail 20B is conductively connected to the conductive segment 232n through the back-side terminal via-connector VB. The back-side power node 240B is conductively connected to the conductive segment 232p through the top-to-bottom via-connector VTB. In FIG. 3B, the front-side signal line 220F is conductively connected to the gate-conductor 250 through the front-side gate via-connector VG. In FIG. 3C, the conductive segment 234p is conductively connected to the conductive segment 234n through the conductive-segment inter-connector MDLI.

Figure 4A:
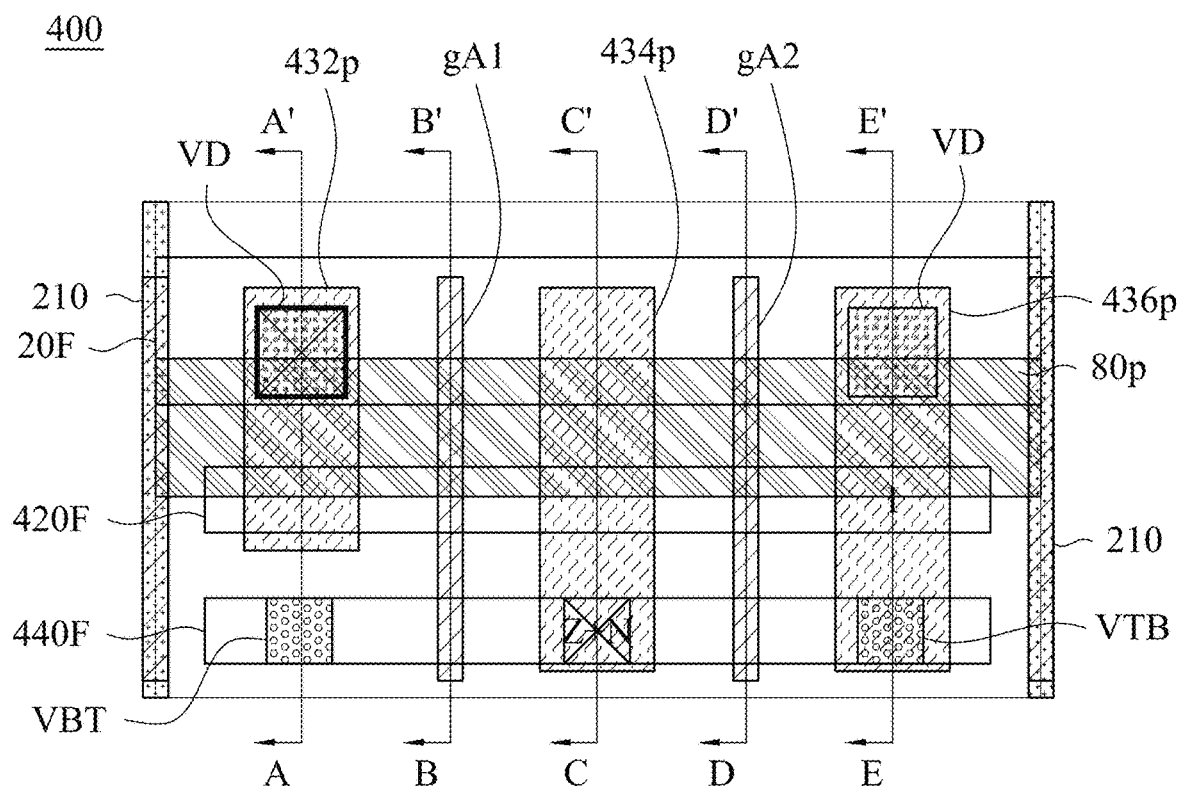
FIG. 4A are layout diagrams of an NAND circuit, in accordance with some embodiments.
Figure 4A:
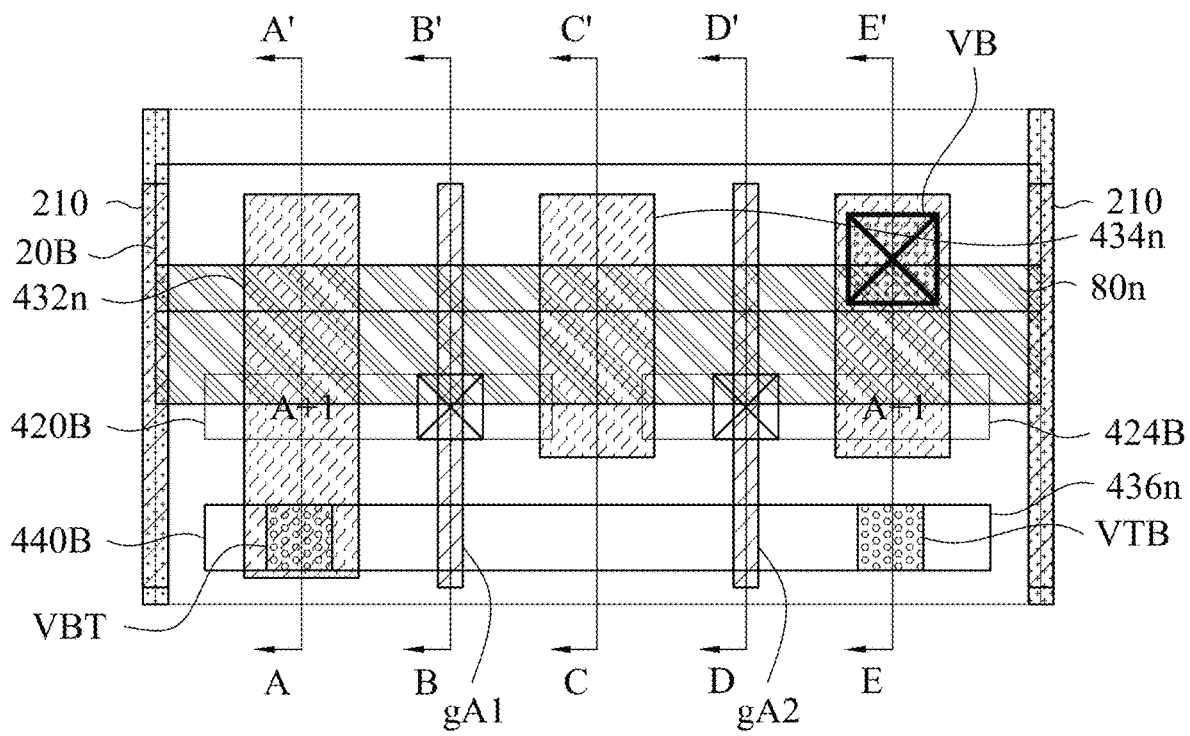
Figure 4B:
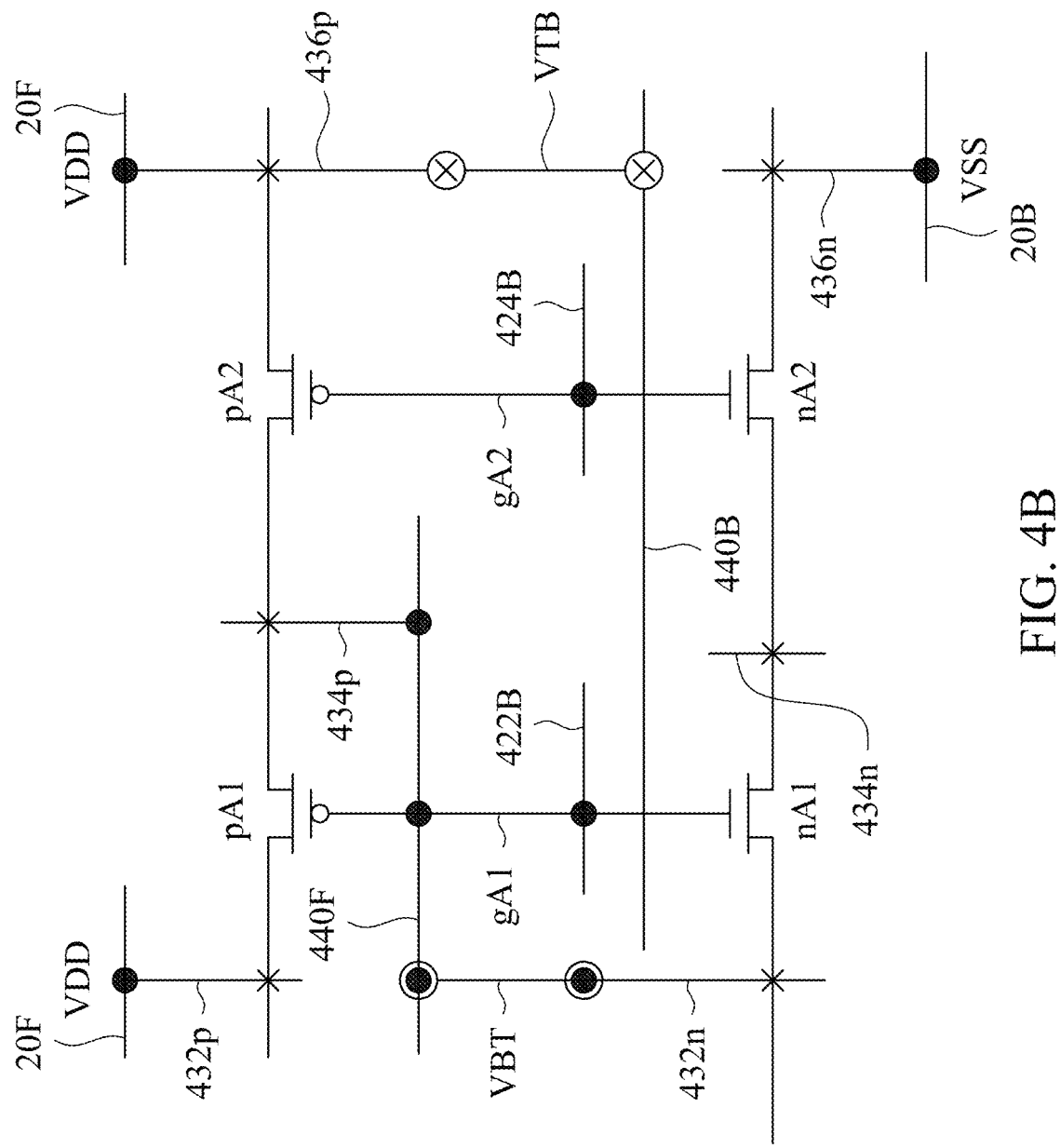
FIG. 4B is an equivalent circuit of the NAND circuit as specified by the layout diagrams in FIG. 4A, in accordance with some embodiments.

FIG. 4A are layout diagrams of an NAND circuit 400, in accordance with some embodiments. FIG. 4B is an equivalent circuit of the NAND circuit 400 as specified by the layout diagram in FIG. 4A, in accordance with some embodiments. The layout diagrams in FIG. 4A include an upper layout diagram and a lower layout diagram. The upper layout diagram includes the layout patterns for specifying the p-type active-region semiconductor structure 80p, two gate-conductors gA1 and gA2, three conductive segments (432p, 434p, and 436p), two front-side signal lines 420F and 440F, the front-side power rail 20F, the dummy gate-conductors 210, and various via-connectors. The lower layout diagram includes the layout patterns for specifying the n-type active-region semiconductor structure 80n, two gate-conductors gA1 and gA2, three conductive segments (432n, 434n, and 436n), two back-side signal lines 422B and 424B, the back-side power node 440B, the back-side power rail 20B, the dummy gate-conductors 210, and various via-connectors.

As specified by the upper layout diagram in FIG. 4A, each of the p-type active-region semiconductor structure 80p, the front-side signal lines 420F and 440F, and the front-side power rail 20F extends in the X-direction. The gate-conductors gA1 and gA2 extending in the Y-direction intersect the p-type active-region semiconductor structure 80p correspondingly at the channel region of PMOS transistors pA1 or pA2. The conductive segments 432p and 436p extending in the Y-direction intersect the p-type active-region semiconductor structure 80p correspondingly at the source region of the PMOS transistor pA1 or pA2. The conductive segment 434p extending in the Y-direction intersects the p-type active-region semiconductor structure 80p at the drain regions of the PMOS transistors pA1 and pA2. Each of the conductive segments 432p and 436p is conductively connected to the front-side power rail 20F through a corresponding front-side terminal via-connector VD. The conductive segments 434p is conductively connected to the front-side signal lines 440F through a corresponding front-side terminal via-connector VD. The front-side signal lines 440F is also directly connected to the bottom-to-top via-connector VBT which is above the conductive segments 432n (in the lower layout diagram of FIG. 4A). The front-side signal lines 420F, which is not directly connected to any circuit nodes in the NAND circuit 400, is configured to route signals between neighboring cells at opposite sides of the NAND circuit. The front-side signal line 440F functions as the output node ZN of the NAND circuit 400.

As specified by the lower layout diagram in BIG. 4A, each of the n-type active-region semiconductor structure 80n, the back-side signal lines 422B and 424B, the back-side power node 440B, and the back-side power rail 20B extends in the X-direction. The gate-conductors gA1 and gA2 extending in the Y-direction intersect the n-type active-region semiconductor structure 80n correspondingly at the channel region of NMOS transistors nA1 or nA2. The conductive segments 436n extending in the Y-direction intersects the n-type active-region semiconductor structure 80n at the source region of the NMOS transistor nA2. The conductive segments 432n extending in the Y-direction intersects the n-type active-region semiconductor structure 80n at the drain region of the NMOS transistor nA2. The conductive segments 434n extending in the Y-direction intersects the n-type active-region semiconductor structure 80n at an active region between the channel regions of the NMOS transistors nA1 and nA2. The conductive segments 436n is conductively connected to the back-side power rail 20B through a corresponding back-side terminal via-connector VB. The conductive segments 432n is directly connected to the bottom-to-top via-connector VBT underneath the front-side signal lines 440F (in the upper layout diagram of FIG. 4A). The back-side signal line 422B is conductively connected to the gate-conductor gA1 through a corresponding back-side gate via-connector BVG. The back-side signal line 424B is conductively connected to the gate-conductor gA2 through a corresponding back-side gate via-connector BVG. The back-side signal lines 422B functions as a first input node A1 of the NAND circuit 400, and the back-side signal lines 424B functions as a second input node A2 of the NAND circuit 400.

In FIG. 4A, the back-side power node 440B is configured for maintaining at the first supply voltage VDD. As specified by the upper layout diagram in FIG. 4A, the conductive segment 436p is directly connected to the top-to-bottom via-connector VTB which is above the back-side power node 440B (in the lower layout diagram of FIG. 4A). As specified by the lower layout diagram in FIG. 4A, the top-to-bottom via-connector VTB is directly connected to the back-side power node 440B. Consequently, the top-to-bottom via-connector VTB directly connects the conductive segment 436p with the back-side power node 440B. Because the conductive segment 436p is conductively connected to the front-side power rail 20F, when the front-side power rail 20F is maintained at the first supply voltage VDD, the back-side power node 440B is also maintained at the first supply voltage VDD.

FIGS. 5A-5E are cross-sectional views of the NAND circuit 400 as specified by the layout diagram in FIG. 4A, in accordance with some embodiments. The cross-sectional views of the NAND circuit 400 in cutting planes as specified by the lines A-A', B-B', C-C', D-D', and E-E' are correspondingly depicted in FIG. 5A, FIG. 5B, FIG. 5C, FIG. 5D, and FIG. 5E. In FIGS. 5A-5E, the p-type active-region semiconductor structure 80p is stacked with n-type active-region semiconductor structure 80n. The front-side power rail 20F is in the front-side conductive layer which is above the p-type active-region semiconductor structure 80p and the n-type active-region semiconductor structure 80n. The front-side signal lines 420F and 440F are also in the front-side conductive layer. The back-side power rail 20B is in the back-side conductive layer which is below the p-type active-region semiconductor structure 80p and the n-type active-region semiconductor structure 80n. The two back-side signal lines (422B and 424B) and the back-side power node 440B are also in the back-side conductive layer.

Figure 5A:
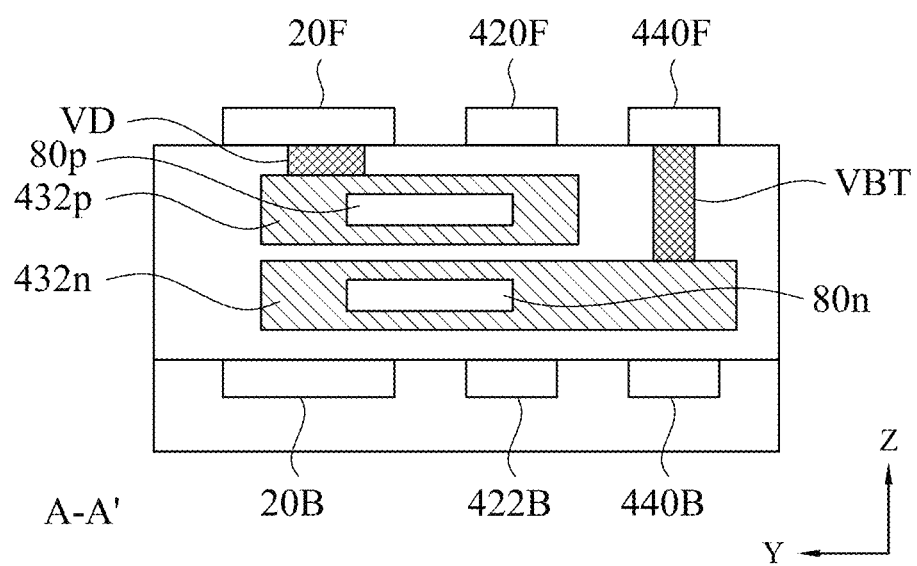
FIGS. 5A-5E are cross-sectional views of the NAND circuit as specified by the layout diagrams in FIG. 4A, in accordance with some embodiments.
Figure 5B:
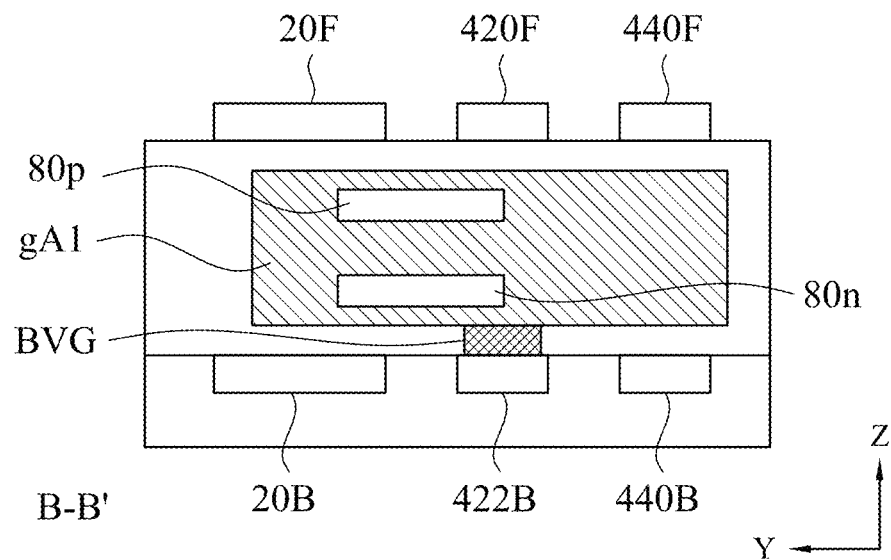
Figure 5C:
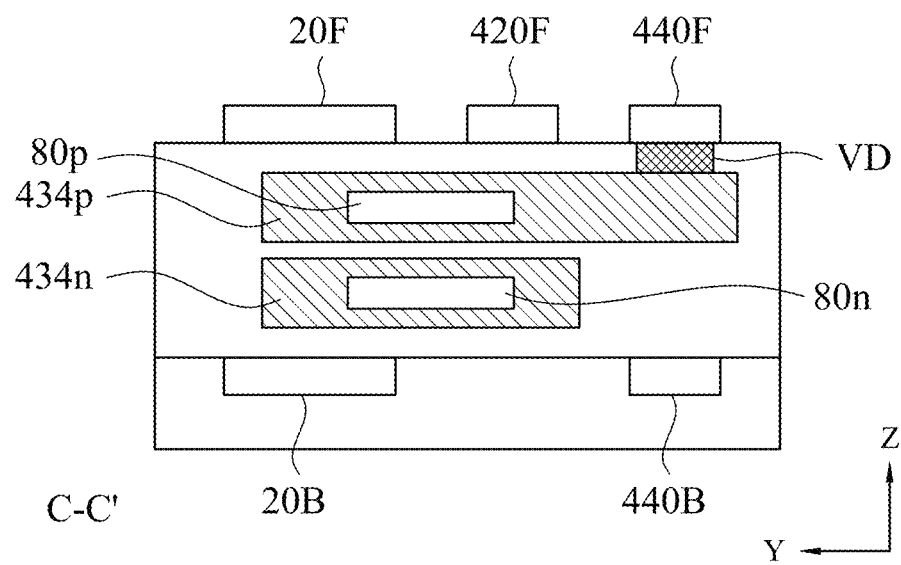
Figure 5D:
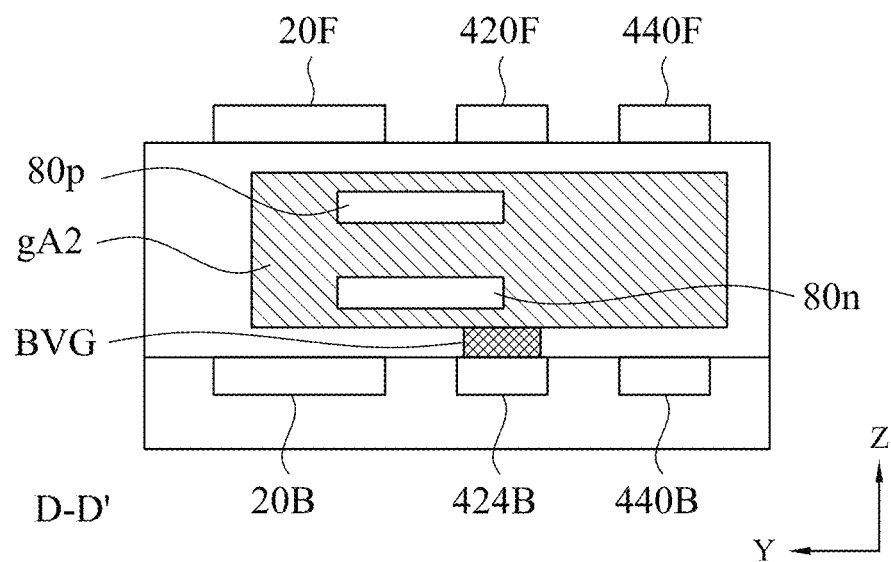
Figure 5E:
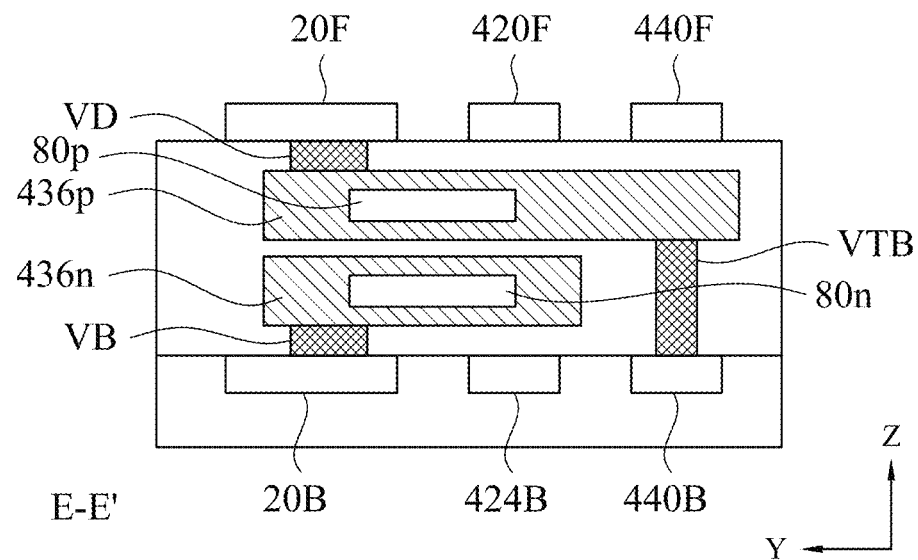

In FIG. 5A, the front-side power rail 20F is conductively connected to the conductive segment 432p through the front-side terminal via-connector VD. The front-side signal line 440F is conductively connected to the conductive segment 432n through the bottom-to-top via-connector VBT. In FIG. 5B, the back-side signal line 422B is conductively connected to the gate-conductor gA1 through the back-side gate via-connector BVG. In FIG. 5C, the front-side signal lines 440F is conductively connected to the conductive segment 434p through the front-side terminal via-connector VD. In FIG. 5D, the back-side signal line 424B is conductively connected to the gate-conductor gA2 through the back-side gate via-connector BVG. In FIG. 5E, the back-side power rail 20B is conductively connected to the conductive segment 436n through the back-side terminal via-connector VB. The back-side power node 440B is conductively connected to the conductive segment 436p through the top-to-bottom via-connector VTB. The conductive segment 436p is conductively connected to the front-side power rail 20F through the front-side terminal via-connector VD.

Figure 6A:
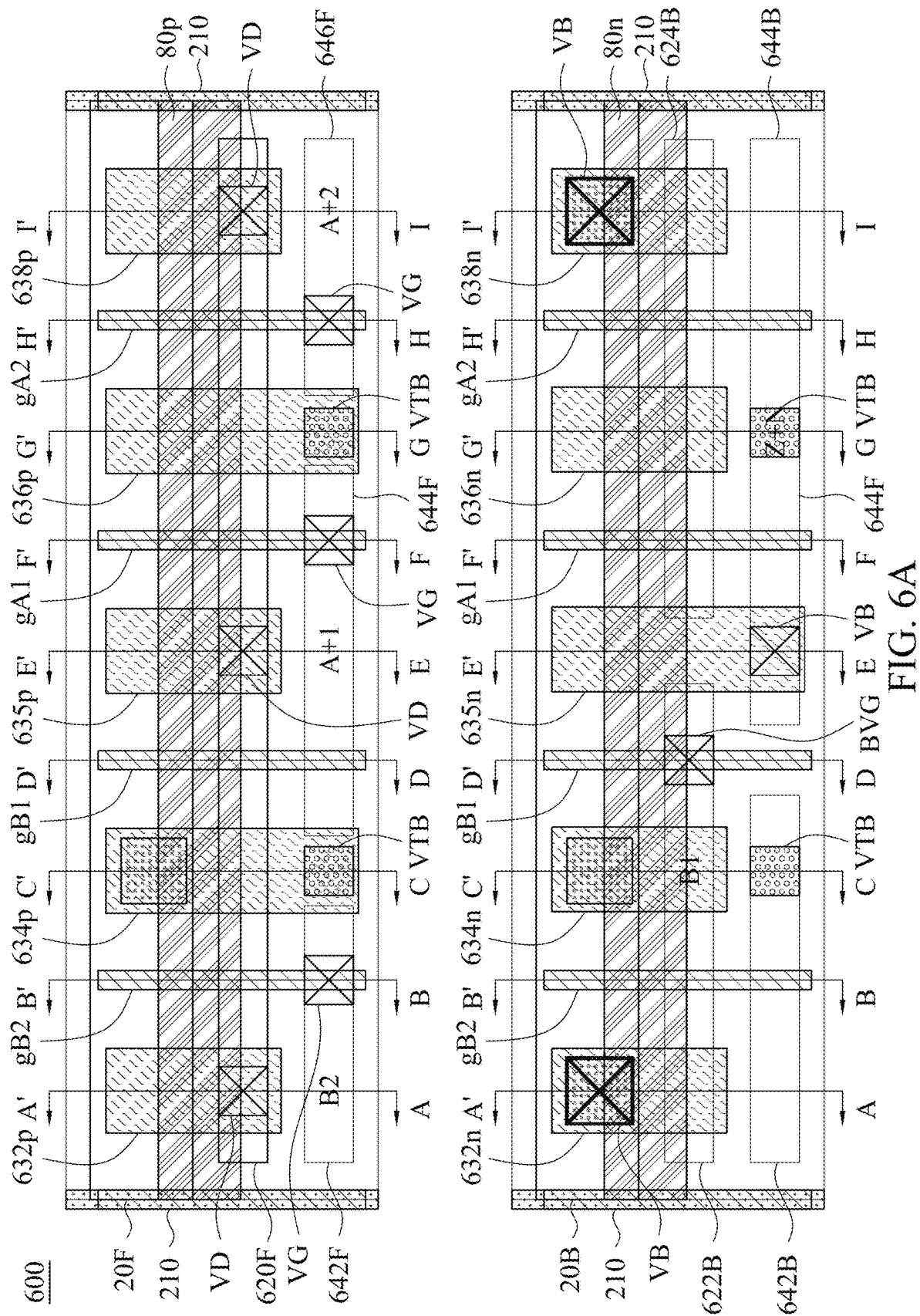
FIG. 6A are layout diagrams of an AND-OR-Invert circuit, in accordance with some embodiments.
Figure 6B:
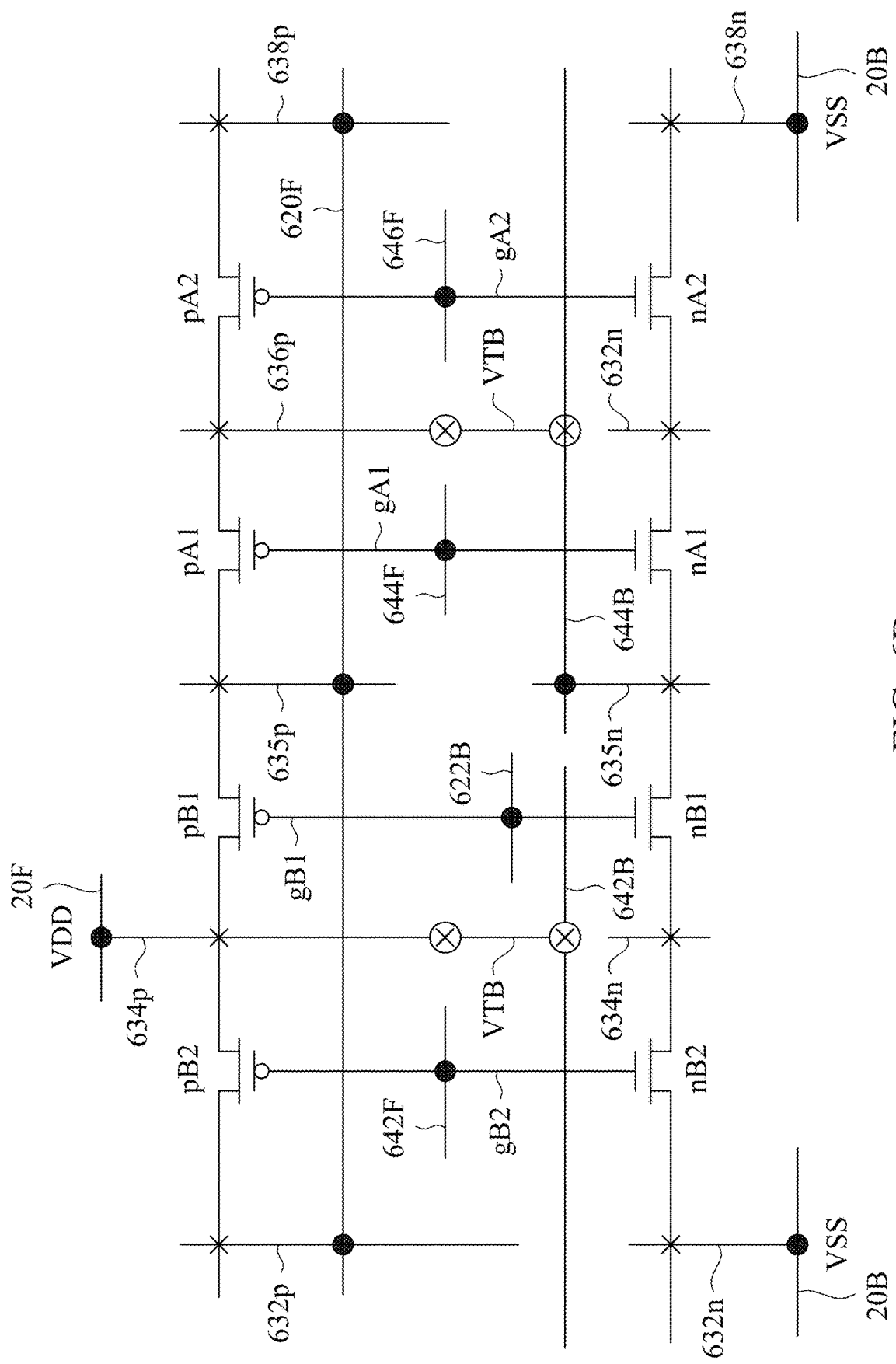
FIG. 6B is an equivalent circuit of the AOI circuit as specified by the layout diagrams in FIG. 6A, in accordance with some embodiments.

FIG. 6A are layout diagrams of an AND-OR-Invert circuit (AOI circuit 600), in accordance with some embodiments. FIG. 6B is an equivalent circuit of the AOI circuit 600 as specified by the layout diagram in FIG. 6A, in accordance with some embodiments. The layout diagrams in FIG. 6A include an upper layout diagram and a lower layout diagram. The upper layout diagram includes the layout patterns for specifying the p-type active-region semiconductor structure 80p extending in the X-direction, four front-side signal lines (620F, 642F, 644F, and 646F) extending in the X-direction, the front-side power rail 20F extending in the X-direction. The upper layout diagram also includes the layout patterns for specifying four gate-conductors (gB2, gB1, gA1 and gA2) extending in the Y-direction, five conductive segments (632p, 634p, 635p, 636p, and 638p) extending in the Y-direction, the dummy gate-conductors 210 extending in the Y-direction, and various via-connectors. The lower layout diagram includes the layout patterns for specifying the n-type active-region semiconductor structure 80n extending in the X-direction, three back-side signal lines (622B, 624B, and 644B) extending in the X-direction, the back-side power node 442B extending in the X-direction, the back-side power rail 20B extending in the X-direction. The lower layout diagram also includes the layout patterns for specifying four gate-conductors (gB2, gB1, gA1 and gA2) extending in the Y-direction, five conductive segments (632n, 634n, 635n, 636n, and 638n) extending in the Y-direction, the dummy gate-conductors 210 extending in the Y-direction, and various via-connectors.

As specified by the upper layout diagram in FIG. 6A, each of the gate-conductors (gB2, gB1, gA1, and gA2) intersects the p-type active-region semiconductor structure 80p correspondingly at the channel region of a corresponding PMOS transistor (pB2, pB1, pA1, or pA2). The conductive segments (632p, 634p, 635p, 636p, and 638p) intersect the p-type active-region semiconductor structure 80p at the terminal regions of the PMOS transistors (pB2, pB1, pA1, or pA2). The terminal region of a PMOS transistor is either a source region or a drain region in the p-type active-region semiconductor structure 80p.

As specified by the upper layout diagram in FIG. 6A, each of the conductive segments 632p, 635p, and 638p is conductively connected to the front-side signal lines 620F through a corresponding front-side terminal via-connector VD. The conductive segment 634p is conductively connected to the front-side power rail 20F through a corresponding front-side terminal via-connector VD. The conductive segment 634p is also directly connected to the top-to-bottom via-connector VTB which is above the back-side power node 642B (in the lower layout diagram of FIG. 6A). The conductive segment 636p is directly connected to the top-to-bottom via-connector VTB above the back-side signal lines 644B (in the lower layout diagram of FIG. 6A). Each of the front-side signal lines 642F, 644F, and 646F is correspondingly connected to one of the gate-conductors gB2, gA1, and gA2 through a corresponding gate via-connector VG. The front-side signal line 642F functions as the input node B2 of the AOI circuit 600, the front-side signal line 644F functions as the input node A1 of the AOI circuit 600, and the front-side signal line 646F functions as the input node A2 of the AOI circuit 600.

As specified by the lower layout diagram in FIG. 6A, each of the gate-conductors (nB2, nB1, nA1, and nA2) intersects the n-type active-region semiconductor structure 80n correspondingly at the channel region of a corresponding NMOS transistor (nB2, nB1, nA1, or nA2). The conductive segments (632n, 634n, 635n, 636n, and 638n) intersect the n-type active-region semiconductor structure 80n at the terminal regions of the NMOS transistors (nB2, nB1, nA1, or nA2). The terminal region of a NMOS transistor is either a source region or a drain region in the n-type active-region semiconductor structure 80n.

As specified by the lower layout diagram in FIG. 6A, each of the conductive segments 632n and 638n is conductively connected to the back-side power rail 20B through a corresponding back-side terminal via-connector VB. The conductive segment 635n is conductively connected to the back-side signal lines 644B through a corresponding back-side terminal via-connector VB. The back-side signal lines 644B is directly connected to the top-to-bottom via-connector VTB underneath the conductive segment 636p (in the upper layout diagram of FIG. 6A). The back-side signal line 644B functions as the output node ZN of the AOI circuit 600. The back-side signal line 622B is conductively connected to the gate-conductor gB1 through a corresponding back-side gate via-connector BVG. The back-side signal line 622B functions as the input node B1 of the AOI circuit 600. The back-side signal line 624B is not directly connected to any circuit nodes in the AOI circuit 600.

In FIG. 6A, the back-side power node 642B is configured for maintaining at the first supply voltage VDD. As specified by the lower layout diagram in FIG. 6A, the back-side power node 642B is directly connected to the top-to-bottom via-connector VTB underneath the conductive segment 634p (in the upper layout diagram of FIG. 6A). As specified by the upper layout diagram in FIG. 6A, the top-to-bottom via-connector VTB underneath the conductive segment 634p is directly connected to the conductive segment 634p, and the conductive segment 634p is conductively connected to the front-side power rail 20F. Consequently, when the front-side power rail 20F is maintained at the first supply voltage VDD, the back-side power node 642B is also maintained at the first supply voltage VDD.

Figure 7A:
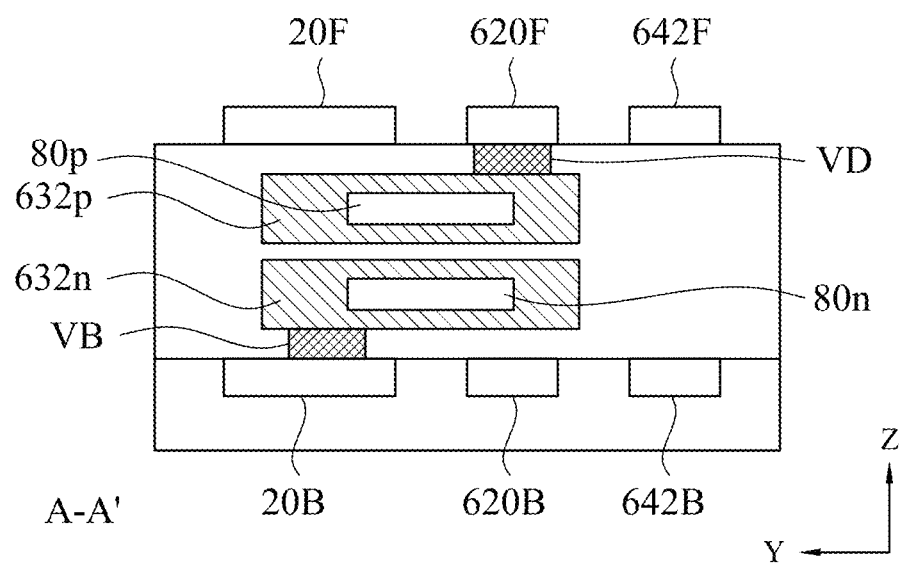
FIGS. 7A-7I are cross-sectional views of the AOI circuit as specified by the layout diagrams in FIG. 7A, in accordance with some embodiments.

FIGS. 7A-7I are cross-sectional views of the AOI circuit 600 as specified by the layout diagram in FIG. 7A, in accordance with some embodiments. The cross-sectional views of the AOI circuit 600 in various cutting planes (as specified by lines such as, A-A', B-B', C-C', . . . , H-H', and I-I') are correspondingly depicted in FIGS. 7A-7I. In FIGS. 7A-7I, the p-type active-region semiconductor structure 80*p* is stacked with n-type active-region semiconductor structure 80*n*. The front-side power rail 20F is in the front-side conductive layer which is above the p-type active-region semiconductor structure 80*p* and the n-type active-region semiconductor structure 80*n*. The front-side signal lines 620F, 642F, 644F, and 646F are also in the front-side conductive layer. The back-side power rail 20B is in the back-side conductive layer which is below the p-type active-region semiconductor structure 80*p* and the n-type active-region semiconductor structure 80*n*. The three back-side signal lines 622B, 624B, and 644B are in the back-side conductive layer, and the back-side power node 642B is also in the back-side conductive layer.

Figure 7B:
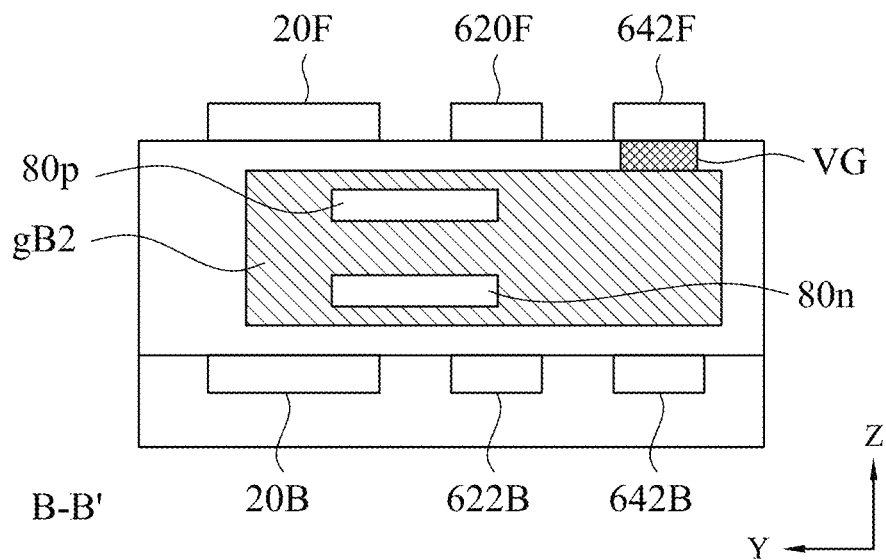
Figure 7C:
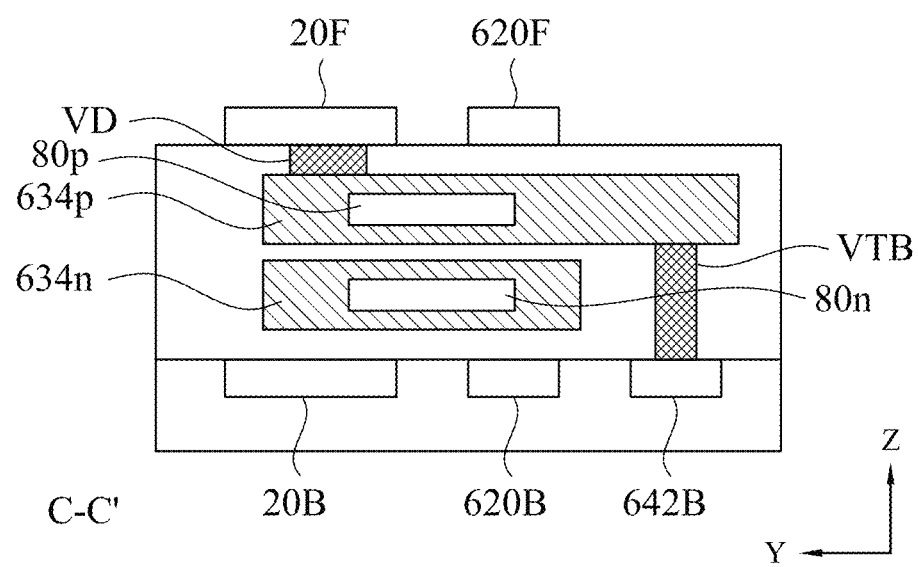
Figure 7D:
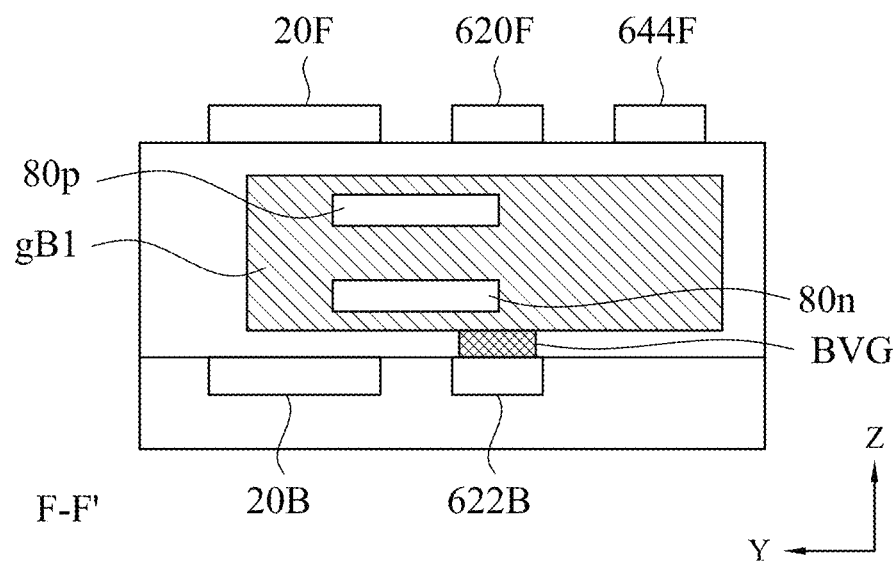
Figure 7E:
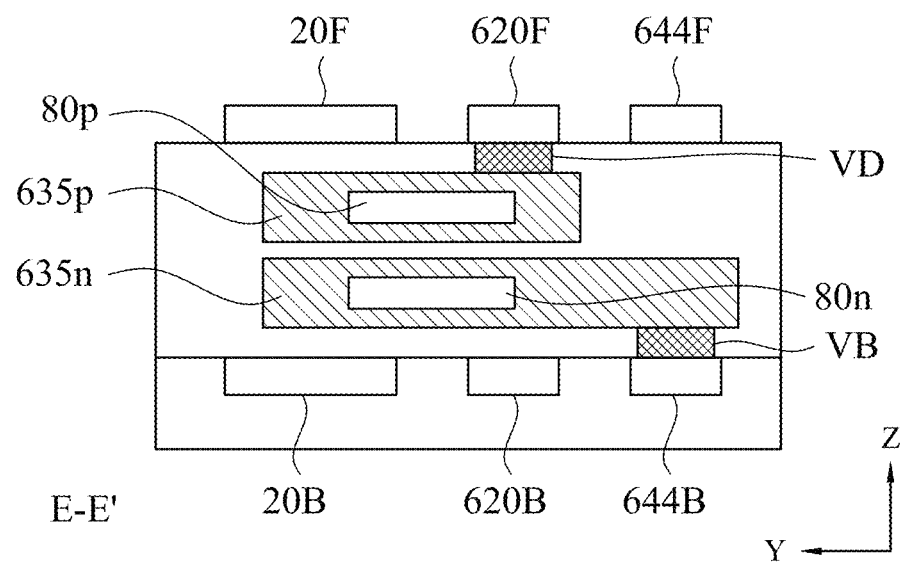
Figure 7F:
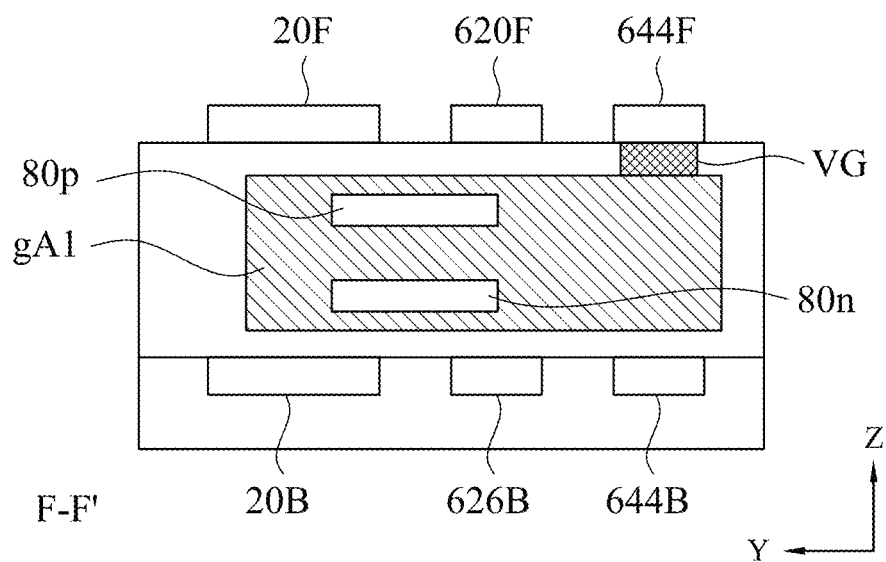
Figure 7G:
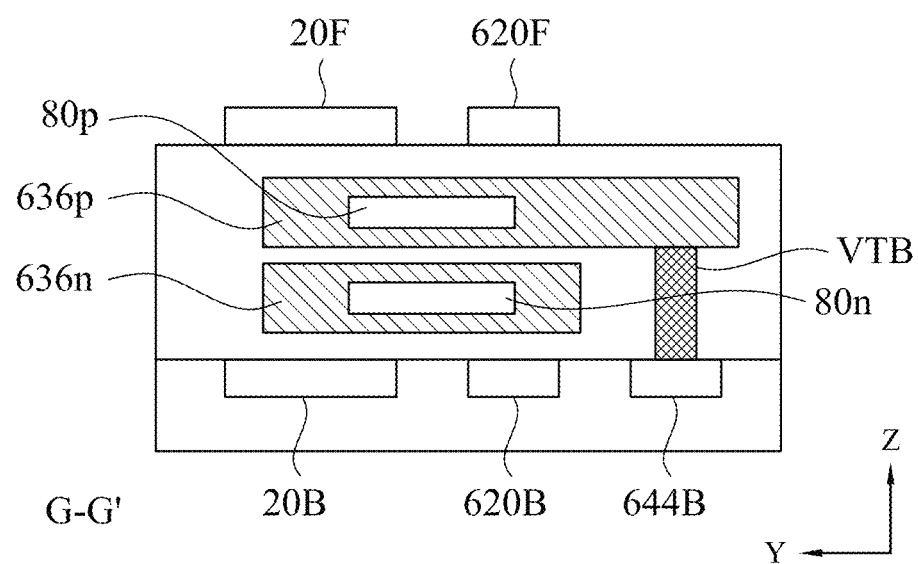
Figure 7H:
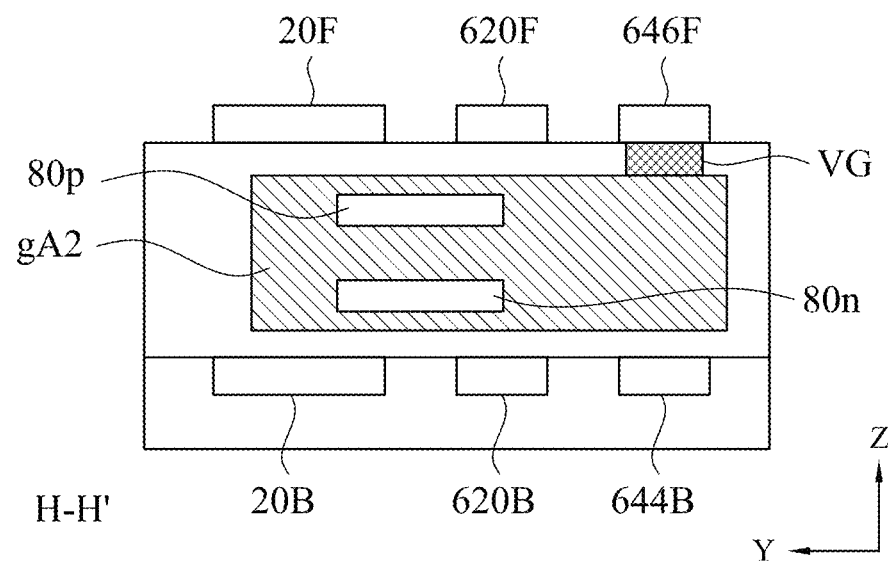
Figure 7I:
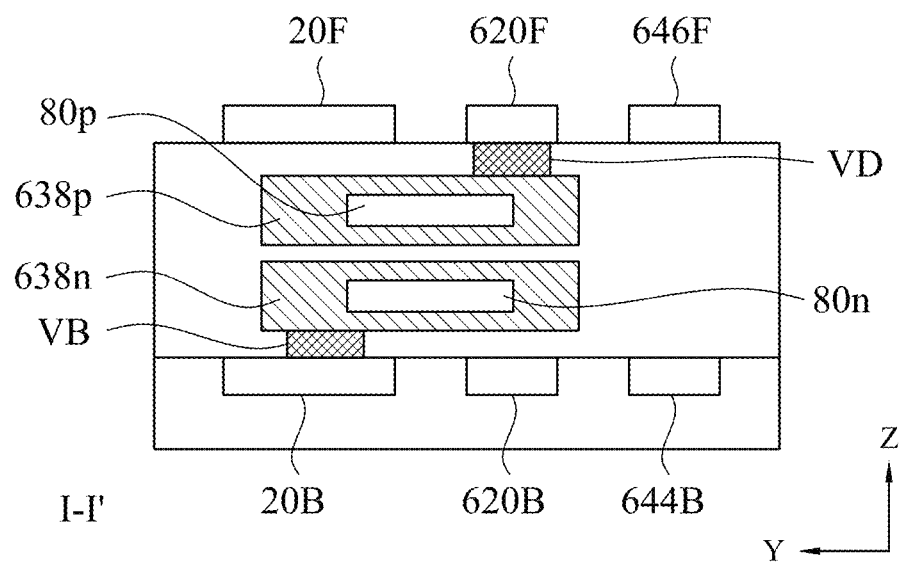

In FIG. 7A, the front-side signal lines 620F is conductively connected to the conductive segment 632*p* through the front-side terminal via-connector VD, and the back-side power rail 20B is conductively connected to the conductive segment 632*n* through the back-side terminal via-connector VB. In FIG. 7B, the front-side signal lines 642F is conductively connected to the gate-conductor gB2 through the front-side gate via-connector VG. In FIG. 7C, the front-side power rail 20F is conductively connected to the conductive segment 634*p* through the front-side terminal via-connector VD, and the conductive segment 634*p* is further conductively connected to the back-side power node 642B through the top-to-bottom via-connector VTB. In FIG. 7D, the back-side signal line 622B is conductively connected to the gate-conductor gB1 through the back-side gate via-connector BVG. In FIG. 7E, the front-side signal lines 620F is conductively connected to the conductive segment 635*p* through the front-side terminal via-connector VD, and the back-side signal line 644B is conductively connected to the conductive segment 635*n* through the back-side terminal via-connector VB. In FIG. 7F, the front-side signal lines 644F is conductively connected to the gate-conductor gA1 through the front-side gate via-connector VG. In FIG. 7G, the conductive segment 636*p* is conductively connected to the back-side signal line 644B through the top-to-bottom via-connector VTB. In FIG. 7H, the front-side signal lines 646F is conductively connected to the gate-conductor gA2 through the front-side gate via-connector VG. In FIG. 7I, the front-side signal lines 620F is conductively connected to the conductive segment 638*p* through the front-side terminal via-connector VD, and the back-side power rail 20B is conductively connected to the conductive segment 638*n* through the back-side terminal via-connector VB.

Figure 8:
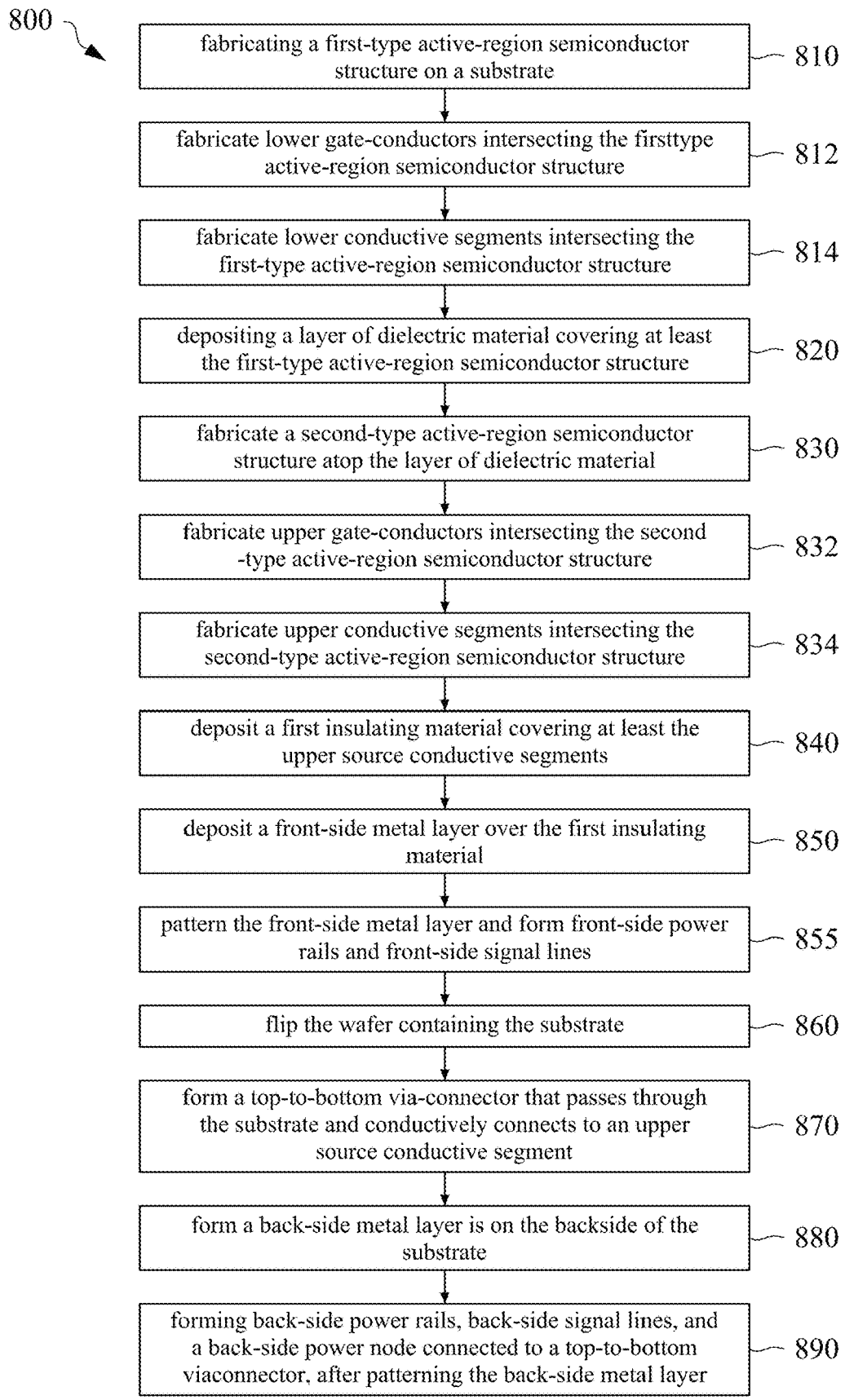
FIG. 8 is a flowchart of a method of manufacturing an integrated circuit (IC) having CFET devices, in accordance with some embodiments.

FIG. 8 is a flowchart of a method 800 of manufacturing an integrated circuit (IC) having CFET devices, in accordance with some embodiments. It is understood that additional operations may be performed before, during, and/or after the method 800 depicted in FIG. 8, and that some other processes may only be briefly described herein.

In operation 810 of method 800, a first-type active-region semiconductor structure is fabricated on a substrate. Then, in operation 812 of method 800, lower gate-conductors are fabricated, where the lower gate-conductors intersect the first-type active-region semiconductor structure. As a non-limiting example, in the embodiments as shown in FIG. 2A and FIGS. 3A-3C, the n-type active-region semiconductor structure 80*n* is fabricated on a substrate in operation 810.

The lower portion of the gate-conductor 250 is fabricated in operation 812, and the lower portion of the gate-conductor 250 intersects the n-type active-region semiconductor structure 80*n*. While the gate-conductor 250 is shown in FIG. 3B, some of the lower gate-conductors fabricated in operation 812 are in other circuit cells, which are not shown in FIGS. 3A-3C.

In addition to operation 812, another operation after operation 810 is operation 814. Lower source conductive segments are fabricated in operation 814, where the lower source conductive segments intersect the first-type active-region semiconductor structure. As a non-limiting example, in the embodiments as shown in FIG. 2A and FIGS. 3A-3C, the conductive segments 232*n* and 234*n* are fabricated in operation 814. The conductive segment 232*n* (as a source conductive segment) intersects the n-type active-region semiconductor structure 80*n* and forms a source terminal of the NMOS transistor. The conductive segment 232*p* (as a drain conductive segment) intersects the n-type active-region semiconductor structure 80*n* and forms a drain terminal of the NMOS transistor. In the process flow of method 800, both operation 812 and operation 814 are carried out after operation 810. In some embodiments, operation 812 is carried out before operation 814. In some alternative embodiments, operation 812 is carried out after operation 814. After operations 810, 812, and 814, the process flow proceeds to operation 820.

In operation 820 of method 800, a layer of dielectric material is deposited and covers at least the first-type active-region semiconductor structure, and in operation 830 of method 800, a second-type active-region semiconductor structure is fabricated atop the layer of dielectric material. As a non-limiting example, in the embodiments as shown in FIG. 2A and FIGS. 3A-3C, the p-type active-region semiconductor structure 80*p* is fabricated atop the layer of dielectric material which is above the n-type active-region semiconductor structure 80*n*. Then, in operation 832 of method 800, upper gate-conductors are fabricated. The upper gate-conductors intersect the second-type active-region semiconductor structure. As a non-limiting example, in the embodiments as shown in FIG. 2A and FIGS. 3A-3C, the upper portion of the gate-conductor 250 is fabricated, and the upper portion of the gate-conductor 250 intersects the p-type active-region semiconductor structure 80*p*. While the gate-conductor 250 is shown in FIG. 3B, some of the upper gate-conductors fabricated in operation 832 are in other circuit cells, which are not shown in FIGS. 3A-3C.

In some embodiments, the lower portion and the upper portion of the gate-conductor 250 are fabricated separately in corresponding operations 812 and 832. In some embodiments, a gate-conductor (such as the gate-conductor 250 in FIG. 3B) includes a lower portion conductively connected to an upper portion. The lower portion intersects the first-type active-region semiconductor structure, and the upper portion intersects the second-type active-region semiconductor structure. The lower portion of the gate-conductor is fabricated as a lower gate-conductor in operation 812 and the upper portion of the gate-conductor is fabricated as an upper gate-conductor in operation 832. Specifically, before the fabrication of the upper portion of the gate-conductor 250, a gate inter-connector passing through the layer of dielectric material above the n-type active-region semiconductor structure 250*n* is fabricated, and the gate inter-connector directly connects the lower portion of the gate-conductor 250 with the upper portion of the gate-conductor 250 to form the integrated gate-conductor 250. In some alternative embodiments, the upper gate-conductor fabricated in operation 832 and the lower gate-conductor fabricated in operation 812 are not directly connected with a gate interconnector.

In addition to operation 832, another operation after operation 830 is operation 834. Upper conductive segments are fabricated in operation 834, where the upper source conductive segments intersect the second-type active-region semiconductor structure. As a non-limiting example, in the embodiments as shown in FIG. 2A and FIGS. 3A-3C, the conductive segment 232p and 234p are fabricated in operation 834. The conductive segment 232p (as a source conductive segment) intersects the p-type active-region semiconductor structure 80p and forms a source terminal of the PMOS transistor. The conductive segment 232p (as a drain conductive segment) intersects the p-type active-region semiconductor structure 80p and forms a drain terminal of the PMOS transistor. In the process flow of method 800, both operation 832 and operation 834 are carried out after operation 830. In some embodiments, operation 832 is carried out before operation 834. In some alternative embodiments, operation 832 is carried out after operation 834. After operations 830, 832, and 834, the process flow proceeds to operation 840.

In operation 840 of method 800, a first insulating material is deposited and covers the upper gate-conductor and the upper source conductive segment. After operation 840, in operation 850 of method 800, a front-side metal layer is deposited over the first insulating material. Then, in operation 855 of method 800, after the front-side metal layer is patterned, front-side power rails and front-side signal lines are formed in the front-side metal layer. One of the front-side power rails is conductively connected to an upper source conductive segment through a front-side terminal via-connector. In some embodiments, one of the front-side signal lines is conductively connected to an upper gate-conductor through a front-side gate via-connector. As a non-limiting example, in the embodiments as shown in FIG. 2A and FIGS. 3A-3C, the front-side power rail 20F and the front-side signal lines (220F and 240F) are fabricated in the front-side metal layer overlying the insulating material covering the gate-conductor 250 and the conductive segment 232p. The front-side power rail 20F is conductively connected to the conductive segment 232p through a front-side terminal via-connector VD. The front-side signal line 220F is conductively connected to the gate-conductor 250 through a front-side gate via-connector VG.

After operations 840, 850, and 855, the wafer containing the substrate is flipped in operation 860. Then, the process flow proceeds to 870. In operation 870 of method 800, a top-to-bottom via-connector is formed. The top-to-bottom via-connector passes through the substrate and conductively connects to an upper source conductive segment. As a non-limiting example, in the embodiments as shown in FIG. 2A and FIGS. 3A-3C, the top-to-bottom via-connector VTB fabricated is connected to the conductive segment 232p. After operation 870, the flow proceeds to operation 880.

In operation 880 of method 800, a back-side metal layer is formed on a backside of the substrate. After operation 880, in operation 885 of method 800, the back-side metal layer is patterned to form back-side power rails, back-side signal lines, and a back-side power node. The back-side power node is connected to a top-to-bottom via-connector formed at operation 870. In some embodiments, one of the back-side power rails is conductively connected to a lower source conductive segment through a second via-connector. As a non-limiting example, in the embodiments as shown in FIG. 2A and FIGS. 3A-3C, the back-side power rail 30B, the back-side signal lines 220B, and the back-side power node 240B are fabricated in back-side metal layer at the backside of the substrate. The top-to-bottom via-connector VTB directly connects the back-side power node with the conductive segment 232p. The back-side power rail 20B is conductively connected to the conductive segment 232n through a back-side terminal via-connector VB. In some embodiments, after operation 885, metal lines in other backside metal layers are fabricated and connected by various backside via connectors.

FIGS. 9A-9B, FIGS. 10A-10B, and FIGS. 11A-11B are layout diagrams of integrated circuits having the circuit cells implemented with back-side power nodes, in accordance with some embodiments. The elements in the integrated circuits as specified by the layout diagrams in FIG. 9A, FIG. 10A, and FIG. 11A include back-side power rails, back-side signal lines, back-side power nodes, and the top-to-bottom via-connectors. Each of the back-side power nodes BPN is configured to maintain a same supply voltage as the supply voltage on the front-side power rails. One or more top-to-bottom via-connectors VTB are configured to apply the supply voltage on the front-side power rails to the back-side power nodes (through one or more source conductive segments). The back-side power nodes BPN are explicitly labeled in FIG. 9A, FIG. 10A, and FIG. 11A. The top-to-bottom via-connectors VTB, however, are identified with VTB layout patterns in FIG. 9A, FIG. 10A, and FIG. 11A, while an example VTB layout pattern is shown in each of the figure legends in FIG. 9A, FIG. 10A, and FIG. 11A.

Figure 9A:
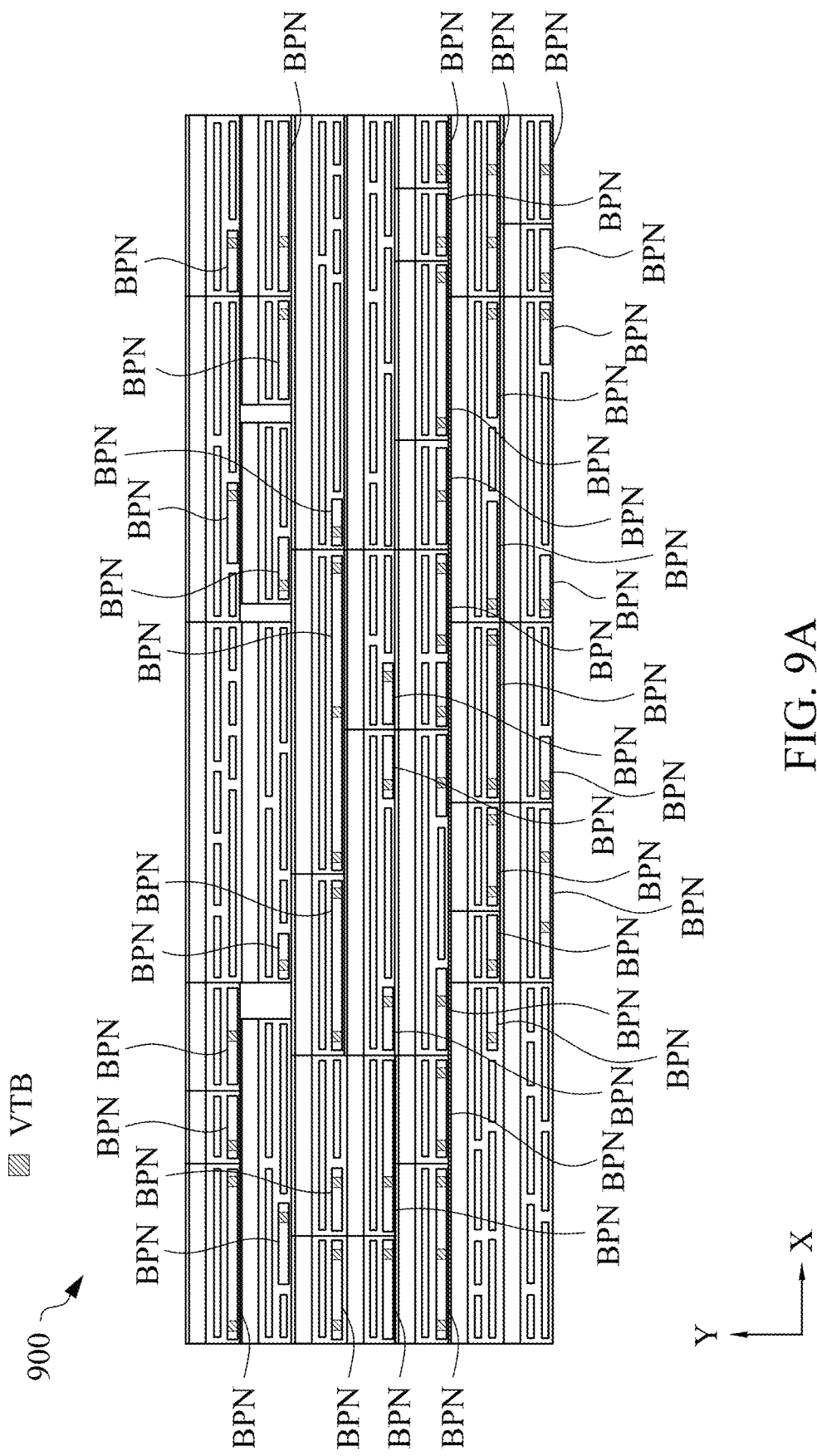
FIGS. 9A-9B are layout diagrams of integrated circuits having the circuit cells implemented with back-side power nodes, in accordance with some embodiments.
Figure 9B:
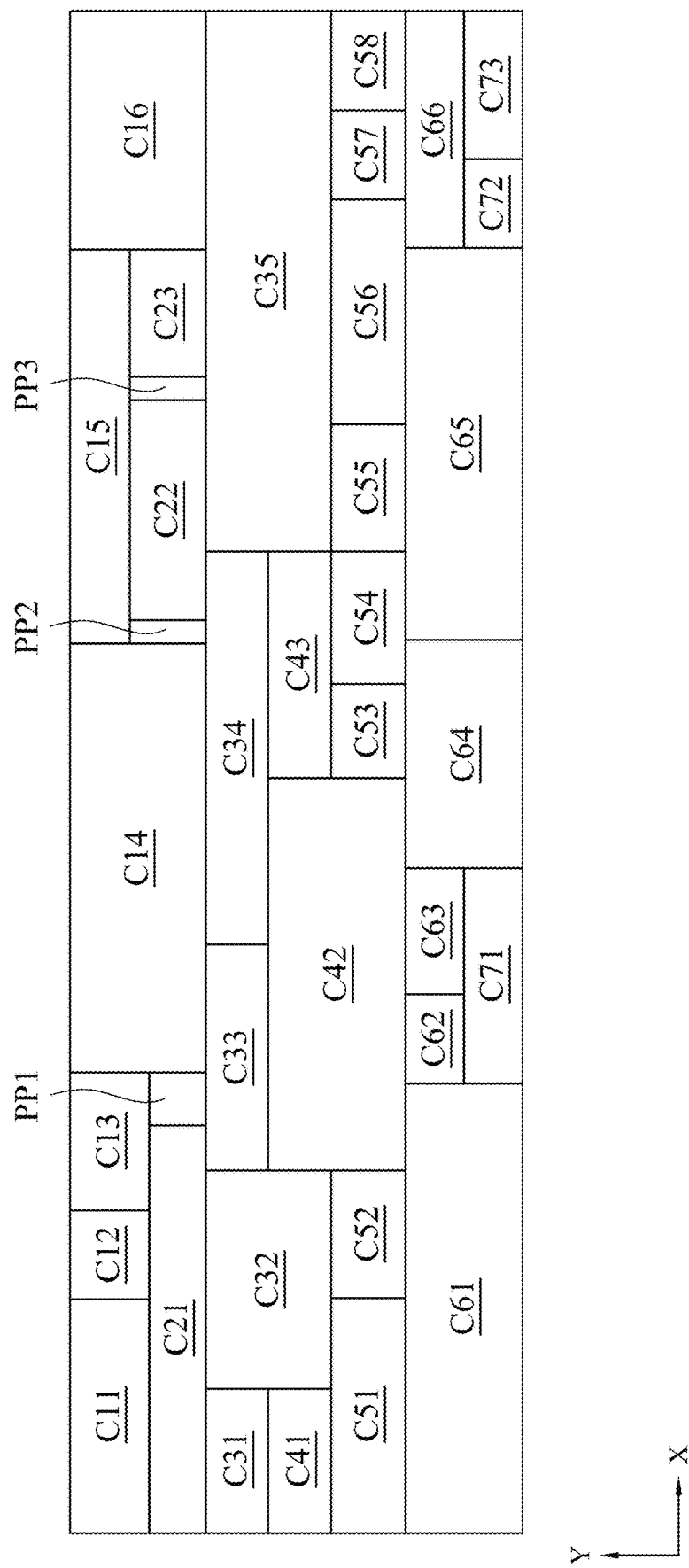
Figure 10A:
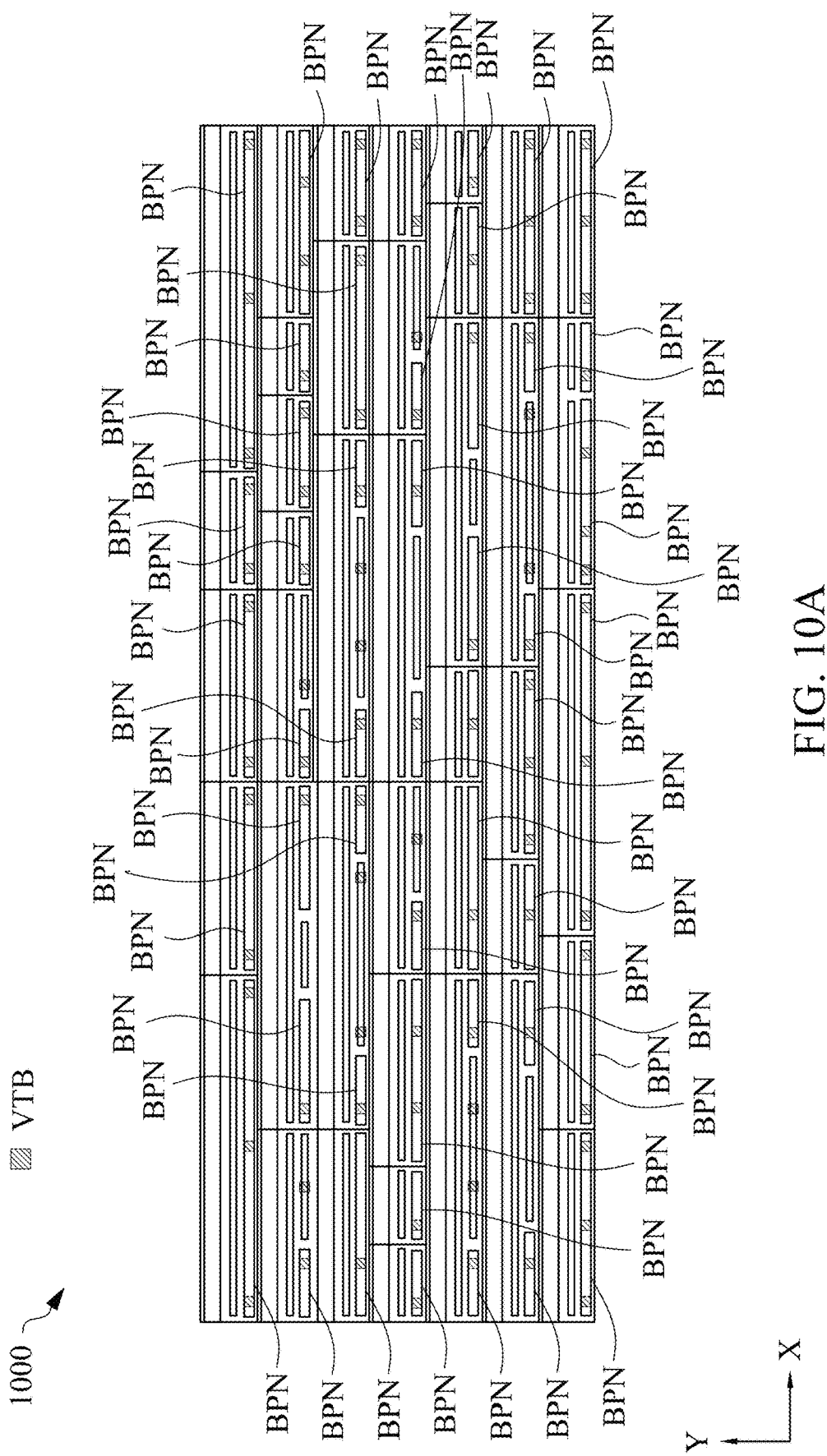
FIGS. 10A-10B are layout diagrams of integrated circuits having the circuit cells implemented with back-side power nodes, in accordance with some embodiments.
Figure 10B:
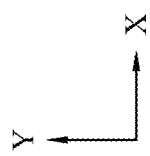
Figure 11A:
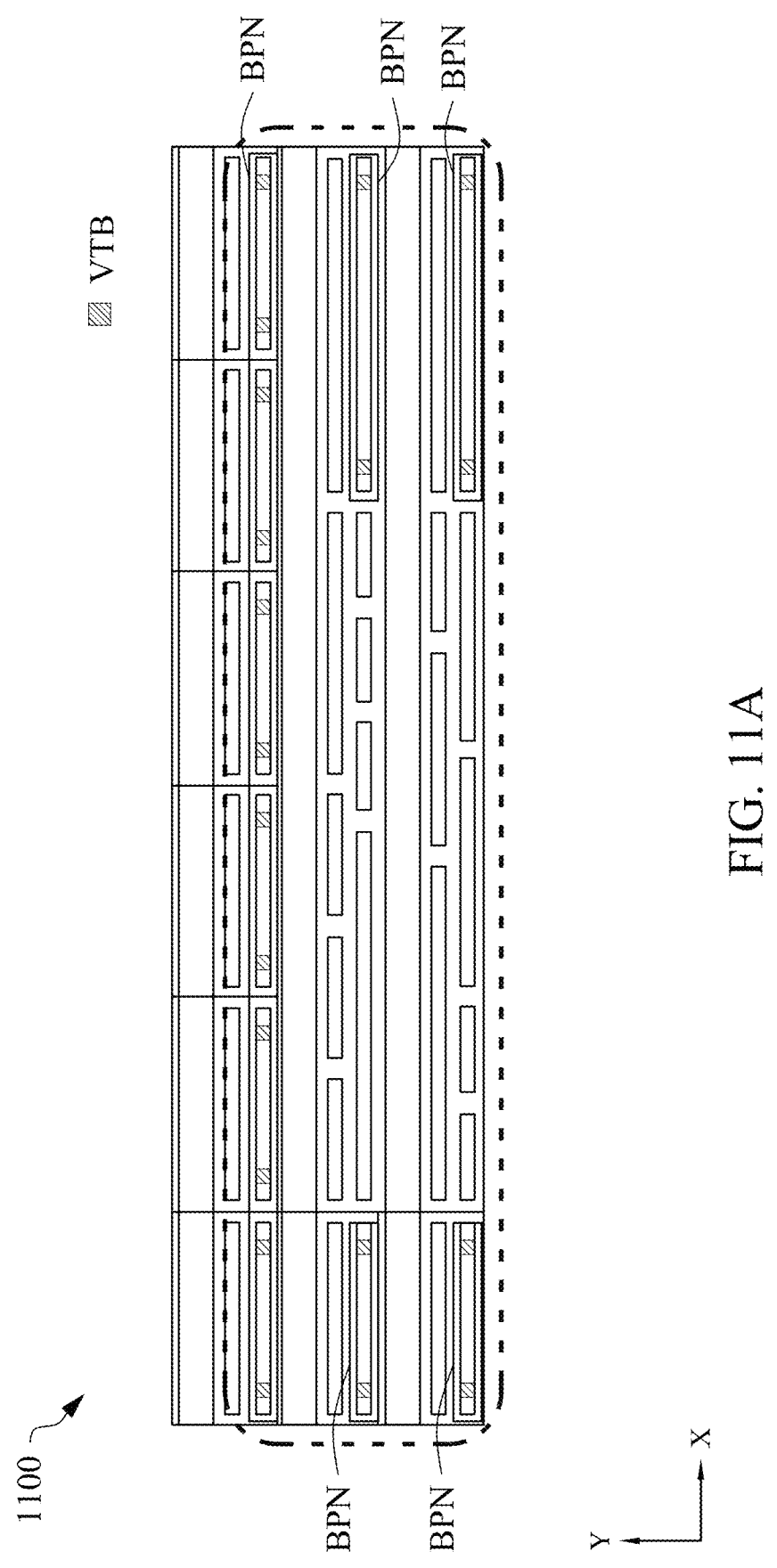
Figure 11B:
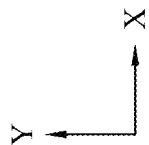

The circuit cells and the associated cell boundaries in the integrated circuit 900 of FIG. 9A are depicted in FIG. 9B. The circuit cells as identified in FIG. 9B include circuit cells C11-C16, C21-C23, C31-C35, C41-C43, C51-C58, C61-C66, and C71-C73. The circuit cells C14, C32, C35, C42, C61, and C65 in FIG. 9B are double height cells. The circuit cells and the associated cell boundaries in the integrated circuit 1000 of FIG. 10A are depicted in FIG. 10B. The circuit cells as identified in FIG. 10B include circuit cells C11-C14, C21-C26, C31-C38, C41-C48, and C51-C56. The circuit cells C13, C21, C22, C34, C35, C36, C41, and C45 in FIG. 10B are double height cells. The circuit cells and the associated cell boundaries in the integrated circuit 1100 of FIG. 11A are depicted in FIG. 11B. The circuit cells as identified in FIG. 11B include circuit cells C11-C16, C21-C23, and C31-C32. The circuit cell C22 in FIG. 11B is a double height cell.

In FIG. 9A, FIG. 10A, and FIG. 11A, each of the circuit cells has a first horizontal boundary at the top of the circuit cell and a second horizontal boundary at the bottom of the circuit cell. Each back-side power node BPN in a circuit cell is adjacent to the second horizontal boundary, while the first horizontal boundary is adjacent to a back-side power rail. The integrated circuit in FIG. 9A or FIG. 10A includes a combination of various circuit cells including inverters, NAND gates, NOR gates, AND-OR-Invert circuits, OR-AND-Invert circuits, and scan flip-flops. In the combination of various circuit cells, some circuit cells (e.g., INVD1) include a single push-pull output driver implemented with one gate-conductor, some circuit cells (e.g., INVD2) include two push-pull output drivers connected in parallel and implemented with two gate-conductors, and some circuit cells (e.g., INVD4) include four push-pull output drivers connected in parallel and implemented with four gate-conductors.

In FIG. 9A, the circuit cells as identified also include power pickup cells PP1, PP2, and PP3. Each of the power pickup cells is implemented to conductively connected at least one front-side power rail to a back-side conducting line that functions as a power node having a same supply voltage as the supply voltage on the at least one front-side power rail. In some embodiments, a power pickup cell is not implemented with any logic functions. When the back-side power nodes BPN are distributed in a selected area of an integrated circuit with a sufficient density, power pickup cells do not need to be added to the selected area. For example, in FIG. 10A, no power pickup cell is added in the part of the integrated circuit 1000 as shown in the figure.

In FIG. 11A, each of the back-side power nodes BPN in the circuit cells C11-C16 is aligned along a second horizontal boundary at the bottom of each circuit cell, and each of the back-side power nodes BPN in the circuit cells C11-C16 has a length almost equal to the full length of the second horizontal boundary of the corresponding cell. In some embodiments, all of the back-side power nodes BPN in the circuit cells C11-C16 aligned along the second horizontal boundary are joined together to form a single joined back-side power node. Due to the conductive connections though the top-to-bottom via-connectors VTB in the circuit cells C11-C16, the back-side power nodes BPN adjacent to the second horizontal boundary of the circuit cells C11-C16 are configured to maintain a supply voltage different from the supply voltage on the back-side power rail adjacent to the first horizontal boundary. In addition to the back-side power nodes BPN in the circuit cells C11-C16, the integrated circuit 1100 also includes the back-side power nodes BPN in the circuit cells C21 and C31 at the left side and the back-side power nodes BPN in the circuit cells C23 and C32 at the right side. The back-side power nodes BPN in the integrated circuit 1100 form an inverted "U" shape arrangement. In some embodiments, because of the inverse "U" shape arrangement, no power pickup cell is added in the part of the integrated circuit 1100 as shown in FIG. 11A.

Figure 12A:
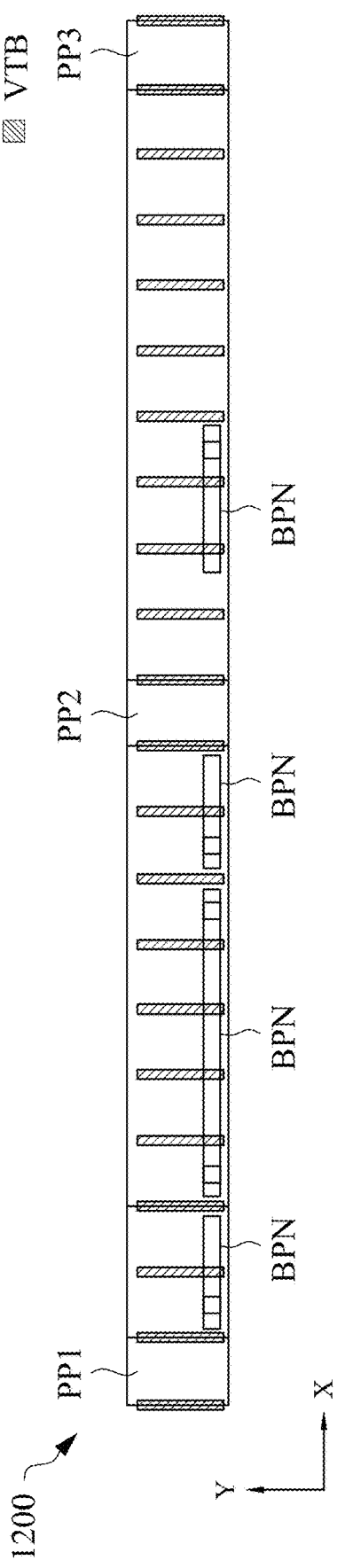
FIGS. 12A-12B are layout diagrams of circuit cells and power pickup cells arranged in a same row, in accordance with some embodiments.
Figure 12B:
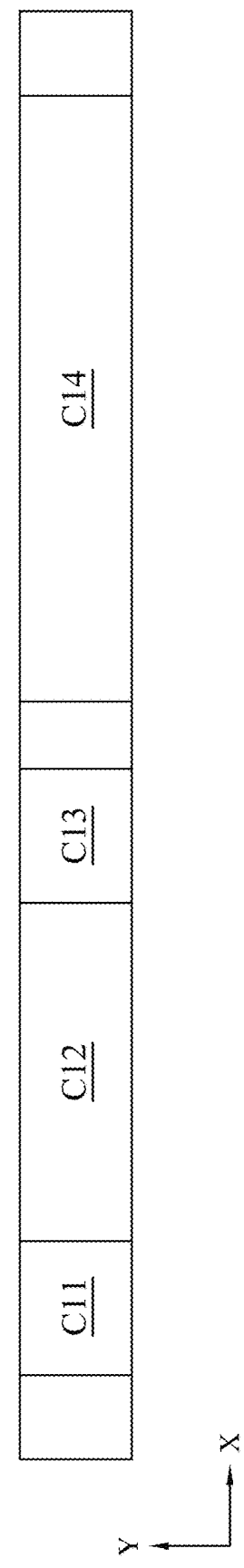

In the integrated circuits of FIG. 10A and FIG. 11A, because of the back-side power nodes BPN, the number of power pickup cells in the integrated circuits is reduced. In some embodiments, even if the number of power pickup cells in an integrated circuit is not reduced, the back-side power nodes BPN enable the reduction of the IR drop between front-side power rails and some of the back-side conducting lines. FIGS. 12A-12B are layout diagrams of circuit cells and power pickup cells arranged in a same row, in accordance with some embodiments. The circuit cells and the associated cell boundaries in the integrated circuit 1200 of FIG. 12A are depicted in FIG. 12B. The integrated circuit 1200 includes circuit cells C11-C14 (as identified in FIG. 12B) and power pickup cells PP1, PP2, and PP3. Each of the circuit cells C11-C14 includes at least one back-side power node BPN which is connected to the front-side power rails (such as, a front-side power rail 20F which is not shown in FIG. 12A) through one or more top-to-bottom via-connectors VTB. Each of the power pickup cells is implemented to conductively connect at least one front-side power rail to a back-side conducting line which receives the power from the at least one front-side power rail. Because of the side power nodes BPN, the integrated circuit 1200 has reduced IR drops between the front-side power rails and the back-side conducting lines for receiving the power from the front-side power rails, as compared with an alternative design of the integrated circuit 1200 in which circuit cells C11-C14 have no back-side power nodes.

Figure 13:
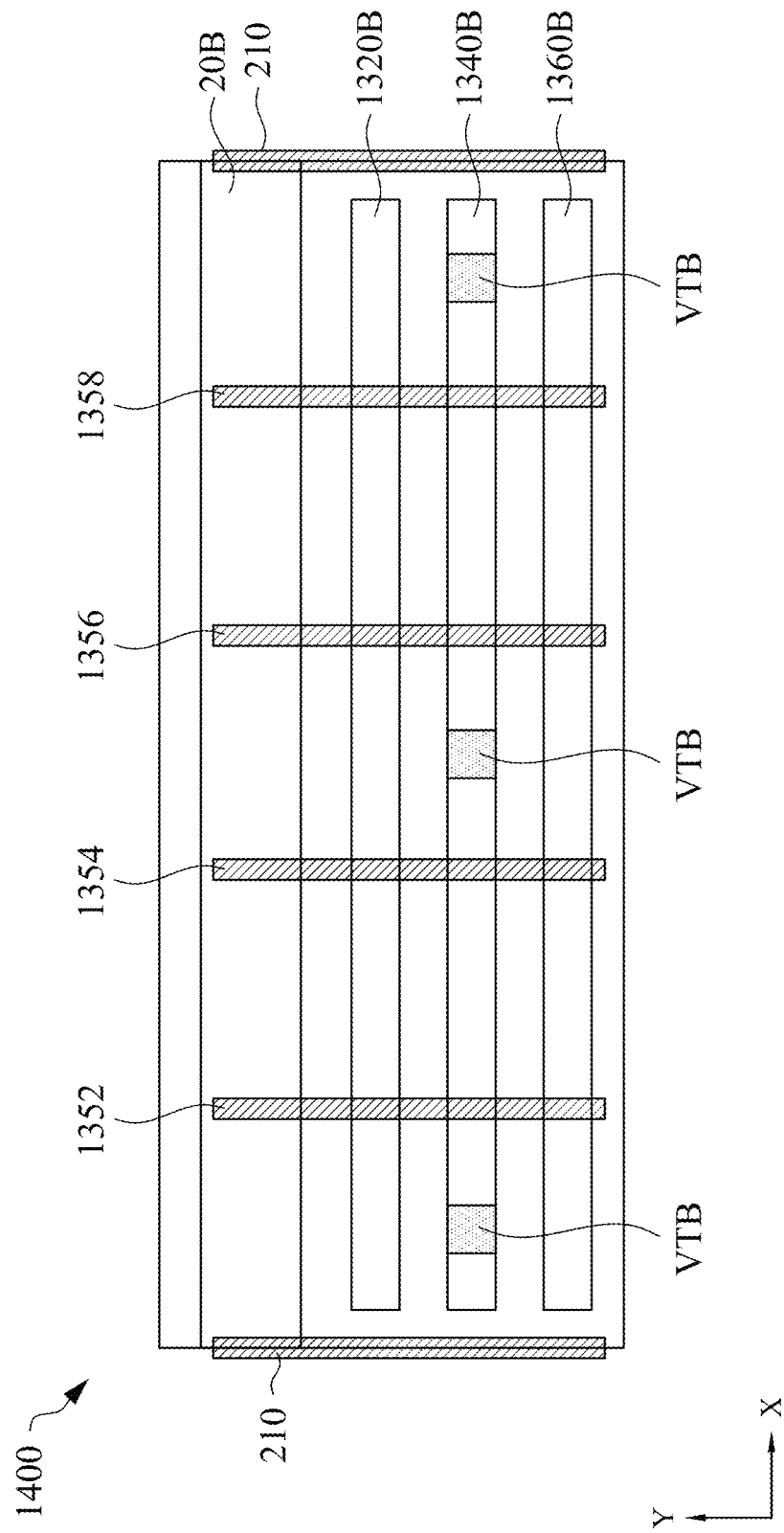
FIG. 13 is a layout diagram of a circuit cell having a back-side power node between two back-side signal lines, in accordance with some embodiments.

In the integrated circuits of FIG. 10A and FIG. 11A, each of the back-side power nodes BPN in the circuit cells C11-C16 is adjacent to the second horizontal boundary at the bottom of each circuit cell. In some alternative embodiments, one or more circuit cells include a back-side power node between a first back-side signal line and a second back-side signal line. FIG. 13 is a layout diagram of a circuit cell 1300 having a back-side power node between two back-side signal lines, in accordance with some embodiments. In FIG. 13, the circuit cell 1300 includes a back-side power rail 20B extending in the X-direction, two back-side signal lines (1320B and 1360B) extending in the X-direction, and a back-side power node 1340B extending in the X-direction, and three top-to-bottom via-connectors VTB. The circuit cell 1300 also includes four gate-conductors (1352, 1354, 1356, and 1358) extending in the Y-direction and dummy gate gate-conductors 210 at the vertical boundaries of the circuit cell 1300.

In FIG. 13, the top-to-bottom via-connectors VTB directly connect the back-side power node 1340B with one or more upper conductive segments (not shown in the figure) which are conductively connected to a front-side power rail (such as a front-side power rail 20F which is not shown in the figure). Consequently, when the front-side power rail is maintained at a predetermined supply voltage, the back-side power node 1340B between the two back-side signal lines (1320 and 1360) is also maintained at the same predetermined supply voltage. Additionally, when the back-side power node 1340B is maintained at the predetermined supply voltage, the back-side power node 1340B (which is a signal ground) functions as signal shields and decouples the capacitive couplings between the two back-side signal lines 1320 and 1360.

Figure 14:
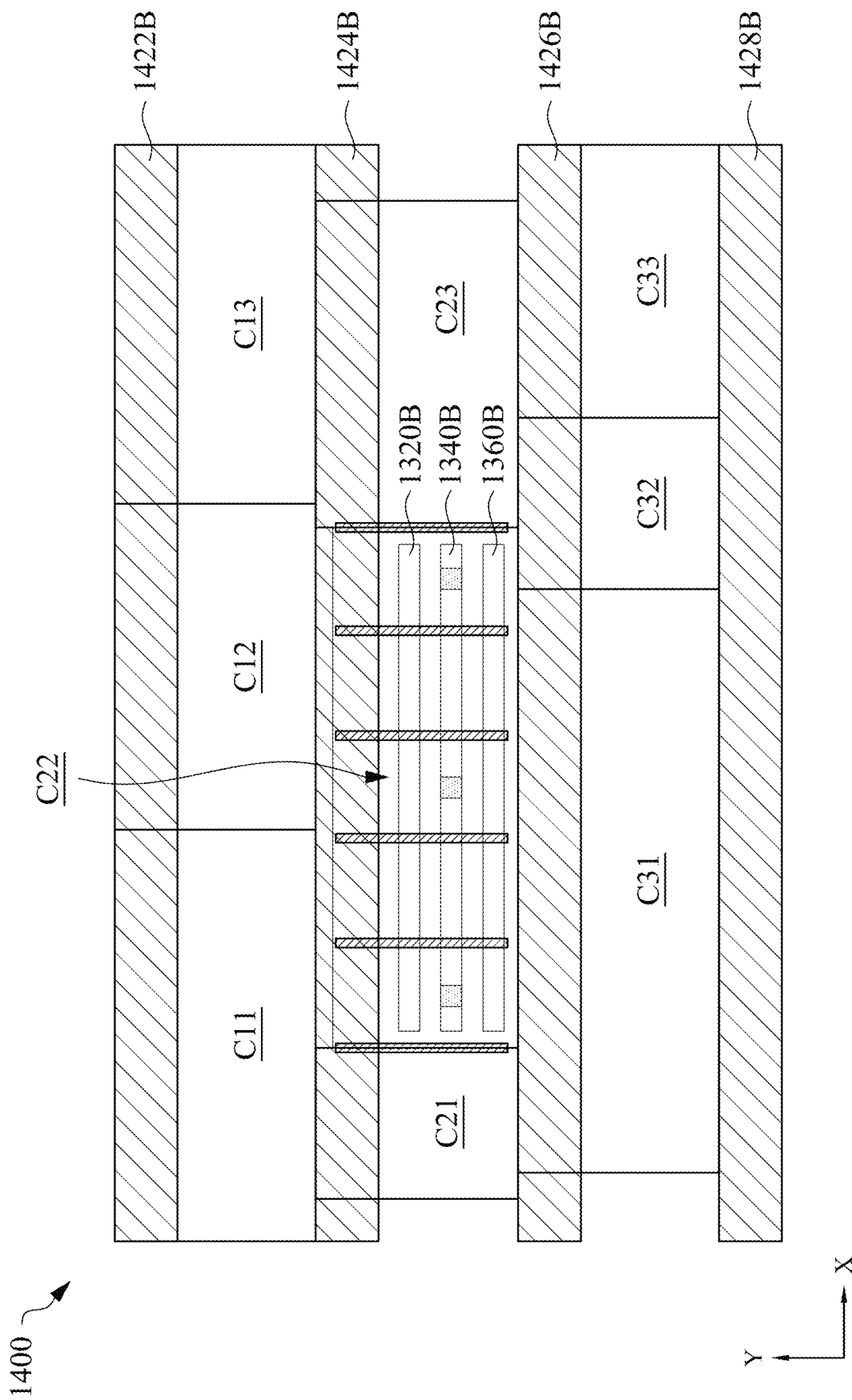
FIG. 14 is a layout diagram of an integrated circuit having the circuit cell of FIG. 13 between two back-side power rails, in accordance with some embodiments.

In some embodiments, each of the back-side power node, the first back-side signal line, and the second back-side signal line in the circuit cell 1300 is between two back-side power rails. FIG. 14 is a layout diagram of an integrated circuit 1400 having the circuit cell 1300 of FIG. 13 between two back-side power rails, in accordance with some embodiments. The integrated circuit 1400 includes back-side power rails 1422B, 1424B, 1426B, and 1428B extending in the X-direction. The integrated circuit 1400 includes circuit cells C11-C13 between back-side power rails 1422B and 1424B, circuit cells C21-C23 between back-side power rails 1424B and 1426B, and circuit cells C31-C33 between back-side power rails 1426B and 1428B.

In FIG. 14, the circuit cell C22 (which is identical to the circuit cell 1300 of FIG. 13) includes a back-side power node 1340B between two back-side signal lines 1320B and 1360B extending in the X-direction. The circuit cell C22 is between the back-side power rails 1424B and 1426B. The two back-side signal lines 1320B and 1360B extending in the X-direction are between the back-side power rails 1424B and 1426B which are adjacent to the circuit cell C22. In some embodiments, both a front-side power rail and the back-side power node 1340B conductively connected to the front-side power rail are configured to have a first supply voltage (such as VDD), while the back-side power rails 1424B is configured to have a second supply voltage (such as VSS). In some embodiments, each of the four back-side power rails 1422B, 1424B, 1426B, and 1428B are configured to have the second supply voltage. In some alternative embodiments, two back-side power rails 1422B and 1426B are configured to have the first supply voltage, while two back-side power rails 1424B and 1428B are configured to have the second supply voltage.

Figure 15:
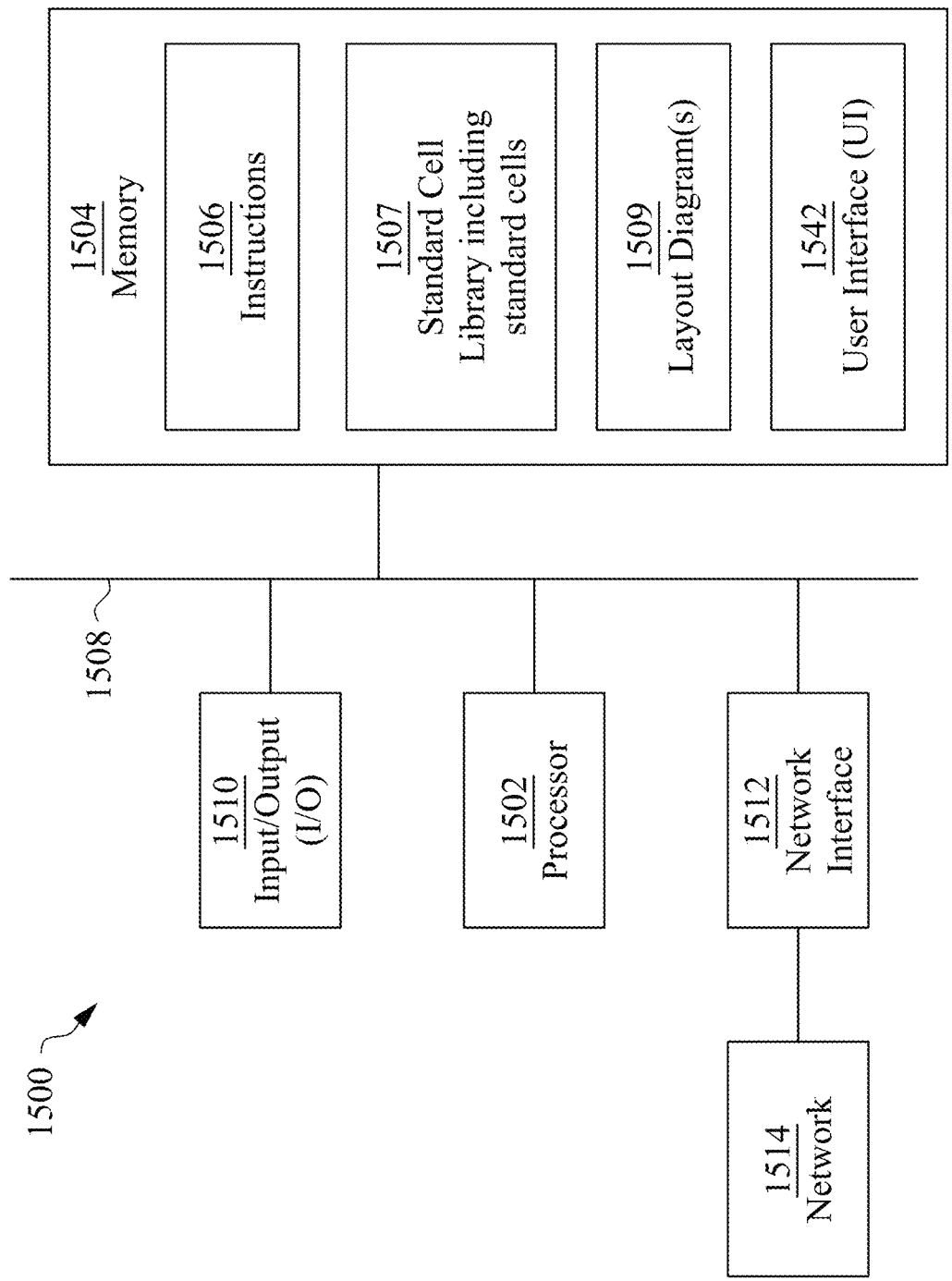
FIG. 15 is a block diagram of an electronic design automation (EDA) system in accordance with some embodiments.

FIG. 15 is a block diagram of an electronic design automation (EDA) system 1500 in accordance with some embodiments.

In some embodiments, EDA system 1500 includes an APR system. Methods described herein of designing layout diagrams represent wire routing arrangements, in accordance with one or more embodiments, are implementable, for example, using EDA system 1500, in accordance with some embodiments.

In some embodiments, EDA system 1500 is a general purpose computing device including a hardware processor 1502 and a non-transitory, computer-readable storage medium 1504. Storage medium 1504, among other things, is encoded with, i.e., stores, computer program code 1506, i.e., a set of executable instructions. Execution of instructions 1506 by hardware processor 1502 represents (at least in part) an EDA tool which implements a portion or all of the methods described herein in accordance with one or more embodiments (hereinafter, the noted processes and/or methods).

Processor 1502 is electrically coupled to computer-readable storage medium 1504 via a bus 1508. Processor 1502 is also electrically coupled to an I/O interface 1510 by bus 1508. A network interface 1512 is also electrically connected to processor 1502 via bus 1508. Network interface 1512 is connected to a network 1514, so that processor 1502 and computer-readable storage medium 1504 are capable of connecting to external elements via network 1514. Processor 1502 is configured to execute computer program code 1506 encoded in computer-readable storage medium 1504 in order to cause system 1500 to be usable for performing a portion or all of the noted processes and/or methods. In one or more embodiments, processor 1502 is a central processing unit (CPU), a multi-processor, a distributed processing system, an application specific integrated circuit (ASIC), and/or a suitable processing unit.

In one or more embodiments, computer-readable storage medium 1504 is an electronic, magnetic, optical, electromagnetic, infrared, and/or a semiconductor system (or apparatus or device). For example, computer-readable storage medium 1504 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1504 includes a compact disk-read only memory (CD-ROM), a compact disk-read/write (CD-R/W), and/or a digital video disc (DVD).

In one or more embodiments, storage medium 1504 stores computer program code 1506 configured to cause system 1500 (where such execution represents (at least in part) the EDA tool) to be usable for performing a portion or all of the noted processes and/or methods. In one or more embodiments, storage medium 1504 also stores information which facilitates performing a portion or all of the noted processes and/or methods. In one or more embodiments, storage medium 1504 stores library 1507 of standard cells including such standard cells as disclosed herein. In one or more embodiments, storage medium 1504 stores one or more layout diagrams 1509 corresponding to one or more layouts disclosed herein.

EDA system 1500 includes I/O interface 1510. I/O interface 1510 is coupled to external circuitry. In one or more embodiments, I/O interface 1510 includes a keyboard, keypad, mouse, trackball, trackpad, touchscreen, and/or cursor direction keys for communicating information and commands to processor 1502.

EDA system 1500 also includes network interface 1512 coupled to processor 1502. Network interface 1512 allows system 1500 to communicate with network 1514, to which one or more other computer systems are connected. Network interface 1512 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1500.

System 1500 is configured to receive information through I/O interface 1510. The information received through I/O interface 1510 includes one or more of instructions, data, design rules, libraries of standard cells, and/or other parameters for processing by processor 1502. The information is transferred to processor 1502 via bus 1508. EDA system 1500 is configured to receive information related to a UI through I/O interface 1510. The information is stored in computer-readable medium 1504 as user interface (UI) 1542.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1500. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 16:
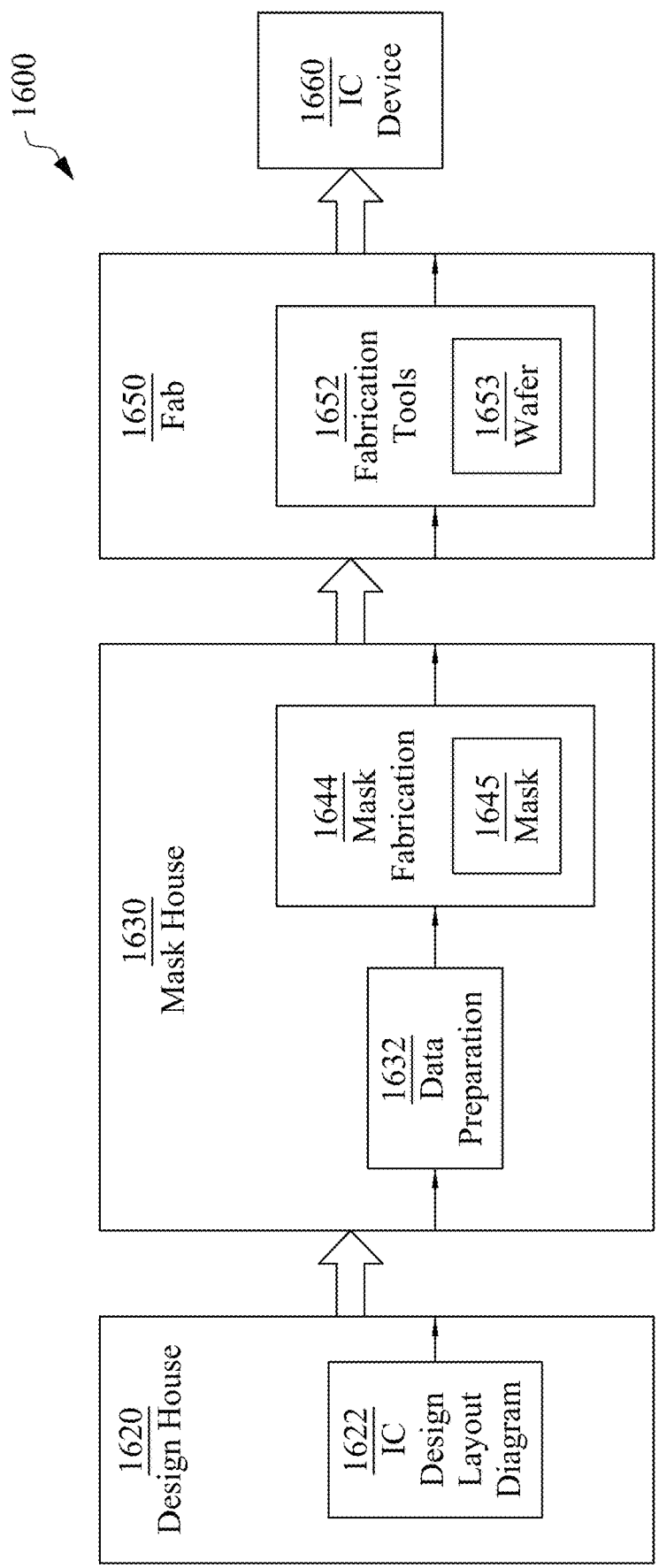
FIG. 16 is a block diagram of an integrated circuit (IC) manufacturing system, and an IC manufacturing flow associated therewith, in accordance with some embodiments.

FIG. 16 is a block diagram of an integrated circuit (IC) manufacturing system 1600, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1600.

In FIG. 16, IC manufacturing system 1600 includes entities, such as a design house 1620, a mask house 1630, and an IC manufacturer/fabricator ("fab") 1650, that interact with one another in the design, development, and manufacturing cycles and/or services related to manufacturing an IC device 1660. The entities in system 1600 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1620, mask house 1630, and IC fab 1650 is owned by a single larger company. In some embodiments, two or more of design house 1620, mask house 1630, and IC fab 1650 coexist in a common facility and use common resources.

Design house (or design team) 1620 generates an IC design layout diagram 1622. IC design layout diagram 1622 includes various geometrical patterns designed for an IC device 1660. The geometrical patterns correspond to patterns of metal, oxide, or semiconductor layers that make up the various components of IC device 1660 to be fabricated. The various layers combine to form various IC features. For example, a portion of IC design layout diagram 1622 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1620 implements a proper design procedure to form IC design layout diagram 1622. The design procedure includes one or more of logic design, physical design or place and route. IC design layout diagram 1622 is presented in one or more data files having information of the geometrical patterns. For example, IC design layout diagram 1622 can be expressed in a GDSII file format or DFII file format.

Mask house 1630 includes data preparation 1632 and mask fabrication 1644. Mask house 1630 uses IC design layout diagram 1622 to manufacture one or more masks 1645 to be used for fabricating the various layers of IC device 1660 according to IC design layout diagram 1622. Mask house 1630 performs mask data preparation 1632, where IC design layout diagram 1622 is translated into a representative data file ("RDF"). Mask data preparation 1632 provides the RDF to mask fabrication 1644. Mask fabrication 1644 includes a mask writer. A mask writer converts the RDF to an image on a substrate, such as a mask (reticle) 1645 or a semiconductor wafer 1653. The design layout diagram 1622 is manipulated by mask data preparation 1632 to comply with particular characteristics of the mask writer and/or requirements of IC fab 1650. In FIG. 16, mask data preparation 1632 and mask fabrication 1644 are illustrated as separate elements. In some embodiments, mask data preparation 1632 and mask fabrication 1644 can be collectively referred to as mask data preparation.

In some embodiments, mask data preparation 1632 includes optical proximity correction (OPC) which uses lithography enhancement techniques to compensate for image errors, such as those that can arise from diffraction, interference, other process effects and the like. OPC adjusts IC design layout diagram 1622. In some embodiments, mask data preparation 1632 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1632 includes a mask rule checker (MRC) that checks the IC design layout diagram 1622 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1622 to compensate for limitations during mask fabrication 1644, which may undo part of the modifications performed by OPC in order to meet mask creation rules.

In some embodiments, mask data preparation 1632 includes lithography process checking (LPC) that simulates processing that will be implemented by IC fab 1650 to fabricate IC device 1660. LPC simulates this processing based on IC design layout diagram 1622 to create a simulated manufactured device, such as IC device 1660. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1622.

It should be understood that the above description of mask data preparation 1632 has been simplified for the purposes of clarity. In some embodiments, data preparation 1632 includes additional features such as a logic operation (LOP) to modify the IC design layout diagram 1622 according to manufacturing rules. Additionally, the processes applied to IC design layout diagram 1622 during data preparation 1632 may be executed in a variety of different orders.

After mask data preparation 1632 and during mask fabrication 1644, a mask 1645 or a group of masks 1645 are fabricated based on the modified IC design layout diagram 1622. In some embodiments, mask fabrication 1644 includes performing one or more lithographic exposures based on IC design layout diagram 1622. In some embodiments, an electron-beam (e-beam) or a mechanism of multiple e-beams is used to form a pattern on a mask (photomask or reticle) 1645 based on the modified IC design layout diagram 1622. Mask 1645 can be formed in various technologies. In some embodiments, mask 1645 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1645 includes a transparent substrate (e.g., fused quartz) and an opaque material (e.g., chromium) coated in the opaque regions of the binary mask. In another example, mask 1645 is formed using a phase shift technology. In a phase shift mask (PSM) version of mask 1645, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1644 is used in a variety of processes. For example, such a mask(s) is used in an ion implantation process to form various doped regions in semiconductor wafer 1653, in an etching process to form various etching regions in semiconductor wafer 1653, and/or in other suitable processes.

IC fab 1650 is an IC fabrication business that includes one or more manufacturing facilities for the fabrication of a variety of different IC products. In some embodiments, IC Fab 1650 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1650 includes fabrication tools 1652 configured to execute various manufacturing operations on semiconductor wafer 1653 such that IC device 1660 is fabricated in accordance with the mask(s), e.g., mask 1645. In various embodiments, fabrication tools 1652 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1650 uses mask(s) 1645 fabricated by mask house 1630 to fabricate IC device 1660. Thus, IC fab 1650 at least indirectly uses IC design layout diagram 1622 to fabricate IC device 1660. In some embodiments, semiconductor wafer 1653 is fabricated by IC fab 1650 using mask(s) 1645 to form IC device 1660. In some embodiments, the IC fabrication includes performing one or more lithographic exposures based at least indirectly on IC design layout diagram 1622. Semiconductor wafer 1653 includes a silicon substrate or other proper substrate having material layers formed thereon. Semiconductor wafer 1653 further includes one or more of various doped regions, dielectric features, multi-level interconnects, and the like (formed at subsequent manufacturing steps).

Details regarding an integrated circuit (IC) manufacturing system (e.g., system 1600 of FIG. 16), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

An aspect of the present disclosure relates to an integrated circuit. The integrated circuit device includes a first-type active-region semiconductor structure extending in a first direction, and a second-type active-region semiconductor structure extending in the first direction. The second-type active-region semiconductor structure is stacked with the first-type active-region semiconductor structure. The integrated circuit device also includes a front-side power rail in a front-side conductive layer above the first-type active-region semiconductor structure and the second-type active-region semiconductor structure, and a back-side power rail in a back-side conductive layer below the first-type active-region semiconductor structure and the second-type active-region semiconductor structure. The front-side power rail extending in the first direction is configured to maintain a first supply voltage. The back-side power rail extending in the first direction is configured to maintain a second supply voltage. The integrated circuit device further includes a source conductive segment intersecting the first-type active-region semiconductor structure at a source region of a transistor, a back-side power node in the back-side conductive layer extending in the first direction, and a top-to-bottom via-connector. The source conductive segment is conductively connected to the front-side power rail through a front-side terminal via-connector. The top-to-bottom via-connector is connected between the source conductive segment and the back-side power node.

Another aspect of the present disclosure relates to an integrated circuit. The integrated circuit device includes a first-type active-region semiconductor structure extending in a first direction, and a second-type active-region semiconductor structure extending in the first direction and stacked with the first-type active-region semiconductor structure. The integrated circuit device also includes a front-side power rail in a front-side conductive layer above the first-type active-region semiconductor structure and the second-type active-region semiconductor structure, and a plurality of back-side power rails in a back-side conductive layer below the first-type active-region semiconductor structure and the second-type active-region semiconductor structure. The front-side power rail extends in the first direction and is configured to maintain a first supply voltage. Each of the back-side power rails extends in the first direction and at least one of the back-side power rails is configured to maintain a second supply voltage. The integrated circuit device further includes a first source conductive segment intersecting the first-type active-region semiconductor structure at a source region of a first-type transistor, a back-side power node in the back-side conductive layer extending in the first direction, and a top-to-bottom via-connector between the first source conductive segment and the back-side power node. The first source conductive segment is conductively connected to the front-side power rail through a front-side terminal via-connector. The back-side power node is conductively connected to the first source conductive segment through the top-to-bottom via-connector.

Still another aspect of the present disclosure relates to a method. The method includes fabricating a first-type active-region semiconductor structure extending in a first direction on a substrate, fabricating a lower source conductive segment intersecting the first-type active-region semiconductor structure at a first source region, depositing a layer of dielectric material covering at least the first-type active-region semiconductor structure, and fabricating a second-type active-region semiconductor structure extending in the first direction atop the layer of dielectric material. The second-type active-region semiconductor structure is stacked with the first-type active-region semiconductor structure. The method also includes fabricating an upper source conductive segment intersecting the second-type active-region semiconductor structure at a second source region, depositing a first insulating material covering at least the upper source conductive segment, depositing a front-side metal layer over the first insulating material, and patterning the front-side metal layer to form a front-side power rail extending in the first direction that is conductively connected to the upper source conductive segment through a front-side terminal via-connector. The method further includes forming a top-to-bottom via-connector that passes through the substrate and conductively connects to the upper source conductive segment, forming a back-side metal layer on a backside of the substrate, and patterning the back-side metal layer to form a back-side power node extending in the first direction that is conductively connected to the top-to-bottom via-connector.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. An integrated circuit device comprising:
 a first-type active-region semiconductor structure extending in a first direction;
 a second-type active-region semiconductor structure extending in the first direction and stacked with the first-type active-region semiconductor structure;

a front-side power rail in a front-side conductive layer above the first-type active-region semiconductor structure and the second-type active-region semiconductor structure, wherein the front-side power rail extending in the first direction is configured to maintain a first supply voltage;

a back-side power rail in a back-side conductive layer below the first-type active-region semiconductor structure and the second-type active-region semiconductor structure, wherein the back-side power rail extending in the first direction is configured to maintain a second supply voltage;

a source conductive segment intersecting the first-type active-region semiconductor structure at a source region of a transistor, and the source conductive segment conductively connected to the front-side power rail through a front-side terminal via-connector;

a back-side power node in the back-side conductive layer extending in the first direction; and a top-to-bottom via-connector connected between the source conductive segment and the back-side power node.

2. The integrated circuit device of claim 1, further comprising:

a front-side signal line extending in the front-side conductive layer;

a back-side signal line extending in the back-side conductive layer; and a drain conductive segment intersecting one or both of the first-type active-region semiconductor structure and the second-type active-region semiconductor structure, and conductively connected to the front-side signal line or the back-side signal line through a third via-connector.

3. The integrated circuit device of claim 1, further comprising:

a first gate-conductor intersecting the first-type active-region semiconductor structure at a channel region of a first-type transistor; and a second gate-conductor intersecting the second-type active-region semiconductor structure at a channel region of a second-type transistor.

4. The integrated circuit device of claim 3, wherein the first gate-conductor is joined with the second gate-conductor to form a third gate-conductor.

5. The integrated circuit device of claim 1, wherein the first-type active-region semiconductor structure is underneath the second-type active-region semiconductor structure.

6. The integrated circuit device of claim 1, wherein each of the first-type active-region semiconductor structure and the second-type active-region semiconductor structure includes at least one nano-sheet.

7. The integrated circuit device of claim 1, wherein each of the first-type active-region semiconductor structure and the second-type active-region semiconductor structure includes at least one nano-wire.

8. An integrated circuit device comprising:

a first-type active-region semiconductor structure extending in a first direction;

a second-type active-region semiconductor structure extending in the first direction and stacked with the first-type active-region semiconductor structure;

a front-side power rail in a front-side conductive layer above the first-type active-region semiconductor structure and the second-type active-region semiconductor structure, wherein the front-side power rail extends in the first direction and is configured to maintain a first supply voltage;

a plurality of back-side power rails in a back-side conductive layer below the first-type active-region semiconductor structure and the second-type active-region semiconductor structure, wherein each of the back-side power rails extends in the first direction and at least one of the back-side power rails is configured to maintain a second supply voltage;

a first source conductive segment intersecting the first-type active-region semiconductor structure at a source region of a first-type transistor, and the first source conductive segment conductively connected to the front-side power rail through a front-side terminal via-connector;

a back-side power node in the back-side conductive layer extending in the first direction; and a top-to-bottom via-connector between the first source conductive segment and the back-side power node, wherein the back-side power node is conductively connected to the first source conductive segment through the top-to-bottom via-connector.

9. The integrated circuit device of claim 8, wherein the back-side power node is adjacent to one of the back-side power rails.

10. The integrated circuit device of claim 8, further comprising:

a first back-side signal line and a second back-side signal line in a circuit cell between two of the back-side power rails; and wherein the back-side power node is between the first back-side signal line and the second back-side signal line.

11. The integrated circuit device of claim 8, further comprising:

a second source conductive segment intersecting the second-type active-region semiconductor structure at a source region of a second-type transistor, and conductively connected to one of the back-side power rails through a back-side terminal via-connector.

12. The integrated circuit device of claim 11, further comprising:

a first gate-conductor intersecting the first-type active-region semiconductor structure at a channel region of the first-type transistor; and a second gate-conductor intersecting the second-type active-region semiconductor structure at a channel region of the second-type transistor.

13. An integrated circuit device comprising:

a first-type active-region semiconductor structure;

a second-type active-region semiconductor structure below the second-type active-region semiconductor structure;

a front-side power rail extending in a first direction above the first-type active-region semiconductor structure and configured to maintain a first supply voltage;

a conductive segment intersecting the first-type active-region semiconductor structure;

a front-side terminal via-connector connected between the conductive segment and the front-side power rail;

a back-side power node extending in the first direction in a back-side conductive layer below the second-type active-region semiconductor structure;

a top-to-bottom via-connector connected between the conductive segment and the back-side power node; and a back-side power rail extending in the first direction in the back-side conductive layer and configured to maintain a second supply voltage.

14. The integrated circuit device of claim 13, further comprising:
   a back-side signal line extending in the back-side conductive layer; and
   a drain conductive segment conductively connected to the back-side signal line through a third via-connector.

15. The integrated circuit device of claim 14, wherein the back-side power node is adjacent to the back-side power rail.

16. The integrated circuit device of claim 14, wherein the back-side power node is between the back-side power rail and the back-side signal line.

17. The integrated circuit device of claim 14, and wherein the drain conductive segment intersecting the first-type active-region semiconductor structure or the second-type active-region semiconductor structure at a drain region of a transistor.

18. The integrated circuit device of claim 13, further comprising:
   a gate-conductor intersecting the first-type active-region semiconductor structure or the first-type active-region semiconductor structure at a channel region of a first-type transistor.

19. The integrated circuit device of claim 13, wherein at least one of the first-type active-region semiconductor structure and the second-type active-region semiconductor structure includes at least one nano-sheet.

20. The integrated circuit device of claim 13, wherein at least one of the first-type active-region semiconductor structure and the second-type active-region semiconductor structure includes at least one nano-wire.

* * * * *